United States Patent
Carlson

(10) Patent No.: US 8,974,274 B2
(45) Date of Patent: Mar. 10, 2015

(54) EVAPORATIVE INDUCTION COOLING

(75) Inventor: Andrew B. Carlson, Atherton, CA (US)

(73) Assignee: Google Inc., Mountain View, CA (US)

(*) Notice: Subject to any disclaimer, the term of this patent is extended or adjusted under 35 U.S.C. 154(b) by 723 days.

(21) Appl. No.: 12/761,981

(22) Filed: Apr. 16, 2010

(65) Prior Publication Data

US 2011/0256822 A1    Oct. 20, 2011

(51) Int. Cl.
| | |
|---|---|
| H05K 5/00 | (2006.01) |
| H05K 7/20 | (2006.01) |
| F24F 5/00 | (2006.01) |
| F28D 5/00 | (2006.01) |
| F24F 1/00 | (2011.01) |

(52) U.S. Cl.
CPC ........ *H05K 7/20827* (2013.01); *H05K 7/20836* (2013.01); *F24F 5/0035* (2013.01); *Y02B 30/545* (2013.01); *F28D 5/00* (2013.01); *F24F 2001/0088* (2013.01); *F24F 2001/0092* (2013.01); *F24F 2203/104* (2013.01)
USPC ............................ 454/184; 62/259.4; 165/222

(58) Field of Classification Search
USPC .............. 454/184; 62/259.4; 165/104.34, 222
See application file for complete search history.

(56) References Cited

U.S. PATENT DOCUMENTS

| | | | | |
|---|---|---|---|---|
| 1,887,938 | A | * | 11/1932 | Lewis ............................ 454/236 |
| 2,118,949 | A | * | 5/1938 | Scott ................................... 62/91 |
| 2,256,940 | A | * | 9/1941 | Crawford ........................... 62/92 |
| 3,997,635 | A | * | 12/1976 | Hallgren ........................ 261/161 |
| 4,103,508 | A | | 8/1978 | Apple |
| 4,118,945 | A | | 10/1978 | Boochever et al. |
| 4,313,310 | A | | 2/1982 | Kobayashi et al. |
| 4,474,027 | A | | 10/1984 | Kaya et al. |
| 4,526,011 | A | | 7/1985 | Logan et al. |
| 4,761,965 | A | | 8/1988 | Viner |
| 4,910,971 | A | * | 3/1990 | McNab ............................ 62/310 |
| 5,529,536 | A | | 6/1996 | Sizemore et al. |
| 5,555,742 | A | | 9/1996 | Kelley |
| 5,643,082 | A | * | 7/1997 | Furukawa ...................... 454/337 |
| 5,664,995 | A | * | 9/1997 | O'Keefe .......................... 454/58 |
| 5,729,983 | A | * | 3/1998 | Garrett et al. .................. 62/46.1 |
| 5,806,762 | A | | 9/1998 | Herr et al. |

(Continued)

FOREIGN PATENT DOCUMENTS

CN    1546911 A    11/2004

OTHER PUBLICATIONS

Notification of Transmittal of the International Search Report and the Written Opinion of the International Searching Authority, or Declaration (2 pages); International Search Report (3 pages); and Written Opinion of the International Searching Authority (4 pages), mailed Oct. 26, 2011, for related international application PCT/US2011/032568.

(Continued)

*Primary Examiner* — Steven B McAllister
*Assistant Examiner* — Jonathan Cotov
(74) *Attorney, Agent, or Firm* — Fish & Richardson P.C.

(57) ABSTRACT

A data center cooling system includes an evaporative cooling system. The evaporative cooling system includes fans configured to circulate outside air at ambient conditions through an entry zone of a data center, and atomizers positioned upstream of the entry zone configured to spray atomized water into the circulating outside air. The atomized water evaporates in an evaporation zone and cools the outside air to produce cooled air, which is directed through racks of computers positioned downstream of the evaporation zone.

29 Claims, 13 Drawing Sheets

(56) References Cited

U.S. PATENT DOCUMENTS

| | | | |
|---|---|---|---|
| 5,943,211 A * | 8/1999 | Havey et al. | 361/699 |
| 6,141,986 A | 11/2000 | Koplin | |
| 6,202,434 B1 * | 3/2001 | Hearne, Jr. | 62/304 |
| 6,374,627 B1 | 4/2002 | Schumacher et al. | |
| 6,386,969 B1 * | 5/2002 | O'Brien | 454/195 |
| 6,412,292 B2 | 7/2002 | Spinazzola et al. | |
| 6,418,728 B1 | 7/2002 | Monroe | |
| 6,557,357 B2 * | 5/2003 | Spinazzola et al. | 62/89 |
| 6,786,056 B2 * | 9/2004 | Bash et al. | 62/199 |
| 6,923,111 B2 * | 8/2005 | Kiefer et al. | 99/468 |
| 7,219,714 B1 | 5/2007 | Heydari | |
| 7,299,647 B2 * | 11/2007 | Tilton et al. | 62/259.2 |
| 7,500,911 B2 | 3/2009 | Johnson et al. | |
| 7,864,530 B1 | 1/2011 | Hamburgen et al. | |
| 8,047,904 B2 * | 11/2011 | Yates et al. | 454/118 |
| 8,162,293 B2 * | 4/2012 | Goldmann et al. | 261/26 |
| 2001/0002541 A1 * | 6/2001 | Patel et al. | 62/259.2 |
| 2002/0102936 A1 * | 8/2002 | Daumler | 454/236 |
| 2003/0173688 A1 | 9/2003 | Koo | |
| 2004/0020224 A1 * | 2/2004 | Bash et al. | 62/228.4 |
| 2004/0206101 A1 | 10/2004 | Bash et al. | |
| 2005/0103032 A1 | 5/2005 | Pierson | |
| 2006/0065000 A1 | 3/2006 | Belady | |
| 2007/0183126 A1 | 8/2007 | Tilton et al. | |
| 2008/0029250 A1 * | 2/2008 | Carlson et al. | 165/104.33 |
| 2008/0055850 A1 * | 3/2008 | Carlson et al. | 361/695 |
| 2008/0204999 A1 | 8/2008 | Clidaras et al. | |
| 2009/0201645 A1 | 8/2009 | Kashirajima et al. | |
| 2009/0310300 A1 * | 12/2009 | Chrysler | 361/691 |
| 2010/0110626 A1 * | 5/2010 | Schmitt et al. | 361/679.47 |
| 2011/0009047 A1 * | 1/2011 | Noteboom et al. | 454/184 |
| 2011/0023506 A1 * | 2/2011 | Day et al. | 62/91 |
| 2011/0175498 A1 * | 7/2011 | Bash et al. | 312/107 |
| 2012/0171943 A1 * | 7/2012 | Dunnavant | 454/184 |
| 2013/0269385 A1 * | 10/2013 | Takahashi et al. | 62/513 |

OTHER PUBLICATIONS

Facebook Prineville Data Center, "Environmental Practices", (Jan. 11, 2010) [retrieved on Jul. 18, 2011]. Retrieved from: <URL: http://www.facebook.com/note.php?note_id=242308668132>, 2 pages.

Open Compute Project, "Data Centers", (Apr. 7, 2011) [retrieved on Jul. 18, 2011]. Retrieved from: <URL: http://opencompute.org/datacenters/>, 42 pages.

Authorized Officer Simin Baharlou, Notification Concerning Transmittal of International Preliminary Report on Patentability for related international application PCT/US2011/032568, mailed Oct. 26, 2012, 6 pages.

* cited by examiner

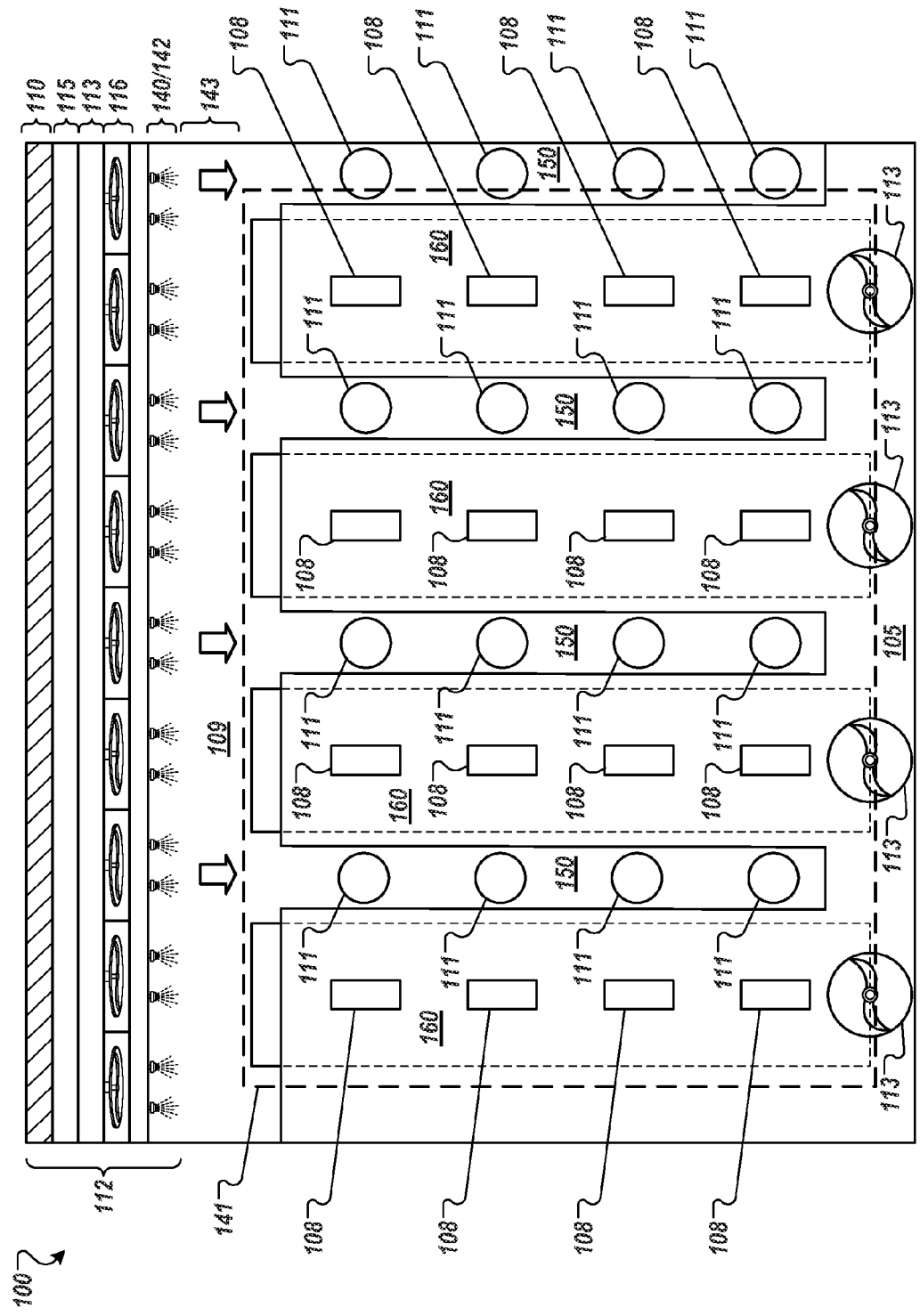

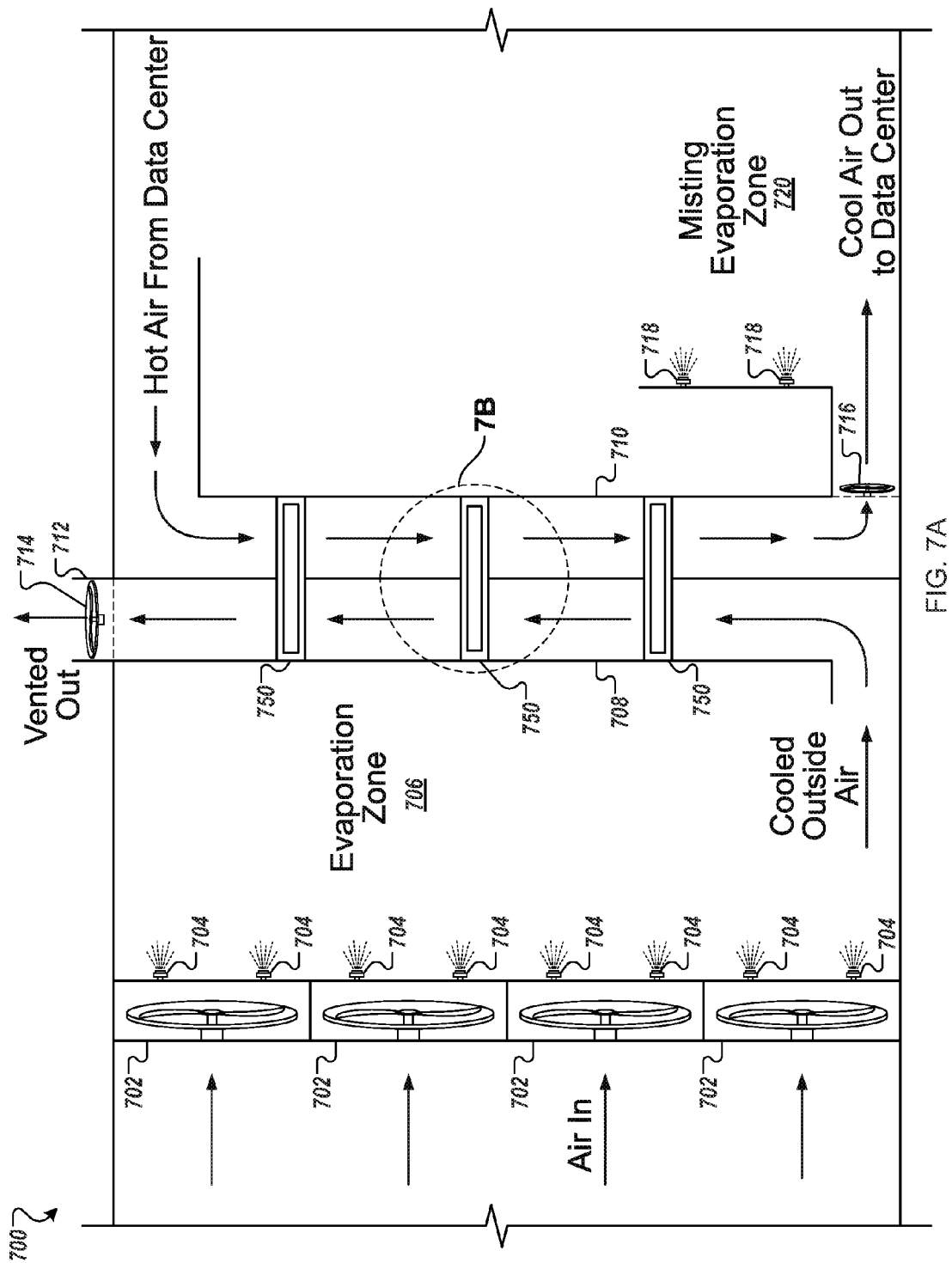

EVAPORATIVE INDUCTION COOLING

TECHNICAL FIELD

This document relates to data center cooling.

BACKGROUND

Computer users often focus on the speed of computer microprocessors (e.g., megahertz and gigahertz). Many forget that this speed often comes with a cost—higher electrical power consumption. For one or two home PCs, this extra power may be negligible when compared to the cost of running the many other electrical appliances in a home. However, in data center applications, where thousands of microprocessors may be operated, electrical power requirements can be very important. Not only must a data center operator pay for electricity to operate its many computers, but the operator must also pay to cool the computers. For example, a pair of microprocessors mounted on a single motherboard can draw 200-400 watts or more of power. Multiply that figure by several thousand (or tens of thousands) to account for the many computers in a large data center, and one can readily appreciate the amount of heat that can be generated.

The cost of removing all of the heat can also be a major cost of operating large data centers. That cost typically involves the use of even more energy, in the form of electricity and natural gas, to operate chillers, condensers, pumps, fans, cooling towers, and other related components. Heat removal can also be important because, although microprocessors may not be as sensitive to heat as are people, increases in heat generally can cause increases in microprocessor errors and failures.

SUMMARY

This specification describes technologies relating to evaporative cooling in data centers. For example, a number of misting nozzles may be placed at an outside air intake to a data center and outdoor air may be circulated past the misting nozzles, so that the air is cooled by the heat of evaporation in water or other liquids that may be evaporated into the airflow.

In an example aspect, a data center cooling system includes a multiple fans configured to circulate outside air at ambient conditions through an entry zone of a data center and multiple atomizers positioned upstream of the entry zone configured to spray atomized water into the circulating outside air. An evaporation zone is provided where the atomized water evaporates and cools the outside air to produce cooled air. A rack zone is positioned downstream of the evaporation zone. The rack zone includes computer racks arranged in substantially parallel rows. The fans are further configured to circulate the cooled air from the evaporation zone into the rack zone.

Implementations may include some, all, or none of the following features, alone or in combination. The cooling system may include a cool air plenum in fluid communication with the evaporation zone and configured to capture the cooled air and direct the cooled air into the rack zone at predetermined discrete locations. The cool air plenum may include one or more conduits positioned above and substantially sealed from the rack zone and can be bordered by one or more diffusers configured to direct the cooled air downwardly into the rack zone. The cool air plenum may include one or more conduits positioned below and substantially sealed from the rack zone and may be bordered by one or more diffusers configured to direct the cool air upwardly into the rack zone.

The system may include a hot air plenum in fluid communication with the rack zone and configured to capture heated air that has been circulated past electronic equipment in the rack zone. The hot air plenum may include one or more conduits positioned above a top level of the rack zone, such that hot air vents upwardly into the hot air plenum. The hot air plenum may include one or more conduits positioned beneath a bottom level of the rack zone. The system can further include one or more fans configured to draw hot air from the rack zone downwardly into the hot air plenum.

The entry zone may be an opening in a wall of the data center and can include louvers extending across the opening. The system may include a filter system positioned inside the entry zone upstream of the fans, to filter outside air entering the entry zone. The system may also include a cool air plenum configured to capture the cooled air and to direct the cooled air into the rack zone. The cool air plenum can include a supply conduit in fluid communication with the evaporation zone, which conduit can extend substantially the width of the rack zone and capture the cooled air from the evaporation zone. Multiple delivery conduits can be connected to the supply conduit, each delivery conduit projecting in a substantially perpendicular direction from the supply conduit and extending substantially the length of the rack zone. The cool air plenum may be positioned above the rack zone and the delivery conduits can be in sealed fluid communication with diffusers configured to direct the cool air downwardly into the rack zone. The cool air plenum may be positioned below a floor that supports equipment in the rack zone, and the delivery conduits can be in sealed fluid communication with diffusers configured to direct the cool air upwardly through perforations in the floor into the rack zone.

The system may include one or more exhaust fans configured to draw into a hot air plenum heated air that has been circulated past electronic equipment in the rack zone. The hot air plenum may be configured to capture the heated air and can include an exhaust conduit that extends substantially the width of the rack zone. The exhaust conduit can be configured to receive the hot air from return conduits and to vent the hot air outside the data center. The return conduits can be connected to the exhaust conduit, and each return conduit can project in a substantially perpendicular direction from the exhaust conduit and extend substantially the length of the rack zone. The return conduits can include one or more apertures, such that the hot air is drawn from the rack zone into the return conduits through the apertures and directed to the exhaust conduit. The delivery conduits of the cool air plenum can be arranged in parallel to the return conduits of the hot air plenum, and alternate with each other across the width of the rack zone.

The entry zone may include an opening in a wall of the data center and a louvers extending across the opening. The fans may be a wall of fans that is substantially the same size as the opening in the wall of the data center. The atomizers may include atomizers spaced at intervals in rows extending across the wall of fans, and/or above and downstream of the fans.

The system may also include a control system. The control system can include; a thermometer configured to measure a wet or dry bulb temperature, or both, of the outside air; a flow meter configured to measure a rate of flow of cooled air into the rack zone; a humidistat configured to measure a humidity level of the cooled air; and a controller. The controller can be configured to receive the measurements from the thermometer, flow meter, and humidistat, and to control the flow rate of water to the atomizers based on the measurements and a temperature and humidity set point for the rack zone.

The system may also include a supplemental cooling system for the data center. The supplemental cooling system can include a cooling tower, a water-to-water heat exchanger in fluid communication with the cooling tower, an air-to-water heat exchanger in fluid communication with the water-to-water heat exchanger. The supplemental cooling system can receive hot air from the rack zone and be arranged to cool the hot air from the rack zone and to recirculate the cooled air back into the rack zone. The controller can be further configured to selectively activate the supplemental cooling system to cool the rack zone, e.g., based on the measurements and on the temperature and relative humidity set point for the rack zone. The supplemental cooling system may also include a chiller in fluid communication with the air-to-water heat exchanger, and the controller may be further configured to selectively activate the chiller based on the measurements and on the temperature and relative humidity set point for the rack zone.

The system may also include a control system including a thermometer configured to measure the temperature of the cool air, a humidistat configured to measure the relative humidity of the cool air, a controller configured to receive the measurements from the thermometer and humidistat and to control the flow rate of water to the plurality of atomizers based on the measurements and a maximum allowable temperature and relative humidity for the rack zone.

In another aspect, a data center cooling system includes fans configured to draw outside air at ambient conditions into an entry zone of a data center, a atomizers positioned downstream of the entry zone configured to spray atomized water into the outside air, and an evaporation zone where the atomized water evaporates and cools the outside air to produce cooled air. A rack zone is positioned downstream of the evaporation zone and includes computer racks arranged in substantially parallel rows. An air-to-air heat exchanger is positioned between the evaporation zone and the rack zone.

Various implementations can include some, all or none of the following features, either alone or in combination. The air-to-air heat exchanger may include one or more heat wheels. A first conduit can be positioned on the evaporation zone-side of the one or more heat wheels and configured to receive the cooled air and direct the cooled air through the one or more heat wheels. A second conduit can be positioned on the rack zone-side of the one or more heat wheels and configured to receive hot air from the rack zone, direct the hot air through the one or more heat wheels and redirect the now cooled air back into the rack zone. A second set of atomizers may be positioned downstream of the heat exchanger and configured to spray atomized water into the cooled air before the cooled air enters the rack zone. A second evaporation zone may be provided where the atomized water from the second set of atomizers evaporates and further cools the air before the air enters the rack zone.

The system may also include a control system that includes: a thermometer configured to measure a temperature of the cooled air redirected back to the rack zone; a flow meter configured to measure a rate of flow of the now cooled air into the rack zone; a humidistat configured to measure a relative humidity of the now cooled air; and a controller. The controller can be configured to receive the measurements from the thermometer, flow meter, and humidistat, and to control the flow rate of water to the atomizers based on the measurements and on a temperature and relative humidity set point for the rack zone. The system may also include a supplemental cooling system for the data center. The supplemental cooling system can include a cooling tower, a water-to-water heat exchanger in fluid communication with the cooling tower, an air-to-water heat exchanger in fluid communication with the water-to-water heat exchanger and positioned to receive hot air from the rack zone. The supplemental cooling system can be activated to cool hot air from the rack zone and to recirculate cooled air back into the rack zone. The controller may be further configured to selectively activate the supplemental cooling system to cool the rack zone, e.g., based on the measurements and on the temperature and relative humidity set point for the rack zone. The supplemental cooling system may also include a chiller in fluid communication with the air-to-water heat exchanger, and the controller may be further configured to selectively activate the chiller, e.g., based on the measurements and on the temperature and relative humidity set point for the rack zone.

In another aspect, a method for cooling a data center includes drawing outside air at ambient conditions into an entry zone of the data center, spraying atomized water into the outside air downstream of the entry zone, providing an evaporation zone where the atomized water evaporates and cools the outside air to cool air, directing the cool air into a rack zone positioned downstream of the evaporation zone that includes computer racks arranged in substantially parallel rows. The rack zone is in fluid communication with the evaporation zone.

Various implementations may include some, all, or none of the following features, either alone or in combination. Directing the cool air into the rack zone may include directing the cooled air into a cool air plenum in fluid communication with the evaporation zone and configured to capture the cooled air and directing the cooled air from the cool air plenum into the rack zone. Hot air from the rack zone may be captured in a hot air plenum in fluid communication with the rack zone and venting the hot air out of the data center. The outside air may be filtered upstream of spraying atomized water into the outside air. A temperature of the outside air may be determined, the rate of flow of cooled air into the rack zone and a humidity level of the cool air, and a flow rate of water to the atomizers may be controlled to generate the spray based on the determinations and on a temperature and humidity set point for the rack zone.

A supplemental cooling system for the data center may be activated based on the determinations and on the temperature and humidity set point for the rack zone. The supplemental cooling system may include a cooling tower, a water-to-water heat exchanger in fluid communication with the cooling tower, an air-to-water heat exchanger in fluid communication with the water-to-water heat exchanger and positioned to receive hot air from the rack zone. The supplemental cooling system may also a chiller in fluid communication with the air-to-water heat exchanger.

The method may also include selectively activating the chiller based on the determinations and on the temperature and humidity set point for the rack zone. The method may also include determining a temperature and a humidity level of the cool air and controlling the flow rate of water to atomizers generating the spray based on the determinations and on a maximum allowable temperature and humidity level for the rack zone. The method may also include selectively activating a supplemental cooling system for the data center based on the determinations and on the maximum allowable temperature and humidity level for the rack zone, wherein the supplemental cooling system may include a cooling tower, a water-to-water heat exchanger in fluid communication with the cooling tower, an air-to-water heat exchanger in fluid communication with the water-to-water heat exchanger and positioned to receive hot air from the rack zone.

In another aspect, outside air at ambient conditions may be drawn into an entry zone of the data center, atomized water may be sprayed into the outside air downstream of the entry zone, an evaporation zone may be provided where the atomized water evaporates and cools the outside air to cool air, the cool air may be directed into an air-to-air heat exchanger that is positioned between the evaporation zone and a rack zone. Hot air may be directed from a rack zone of the data center into the air-to-air heat exchanger, which cools the hot air to cooled air. The cooled air may be recirculated from the heat exchanger back into the rack zone. The rack zone includes computer racks arranged in a substantially parallel rows. The air may be sprayed with atomized water to further cool the air before the cooled air is recirculated back into the rack zone.

The air-to-air heat exchanger may include one or more heat wheels. A first conduit can be positioned on the evaporation zone-side of the one or more heat wheels and configured to receive the cool air and direct the cool air through the one or more heat wheels. A second conduit can be positioned on the rack zone-side of the one or more heat wheels and configured to receive hot air from the rack zone and the direct the hot air through the one or more heat wheels to cool the air. The method may also include determining the temperature, humidity level and/or flow rate of the cooled air being recirculated back to the rack zone and controlling the flow rate of water to the atomizers generating the spray based on the determinations and on a temperature and humidity set point for the rack zone.

The systems and techniques described herein can include the following advantages. Facility cooling can be achieved using less energy thereby conserving resources and reducing costs.

The details of one or more embodiments are set forth in the accompanying drawings and the description below. Other features and advantages will be apparent from the description and drawings, and from the claims.

DESCRIPTION OF DRAWINGS

FIGS. 1A-1D illustrate several views of an example data center that can utilize evaporative cooling.

FIGS. 7A-7B are magnified views of the air-to-air heat wheel heat exchangers.

Like reference symbols in the various drawings indicate like elements.

DETAILED DESCRIPTION

The large number of computers operating in a computer data center can generate a great deal of heat. This heat can be damaging to the computers, and therefore should be removed. Generally, computers are air-cooled wherein relatively cool air is drawn across the computers to absorb the generated heat (though water cooling may be provided in spot applications such as on microprocessors and other high-heat-generating components). In a typical data center, the warmed air is cooled actively (e.g., by air conditioning), but such active cooling can consume a great deal of power in the process.

Methods and systems are described herein that can conserve power while cooling a data center using evaporative cooling. The evaporative cooling can be used, in some implementations, in combination with other cooling systems and techniques, as is described below.

Figure 1A:
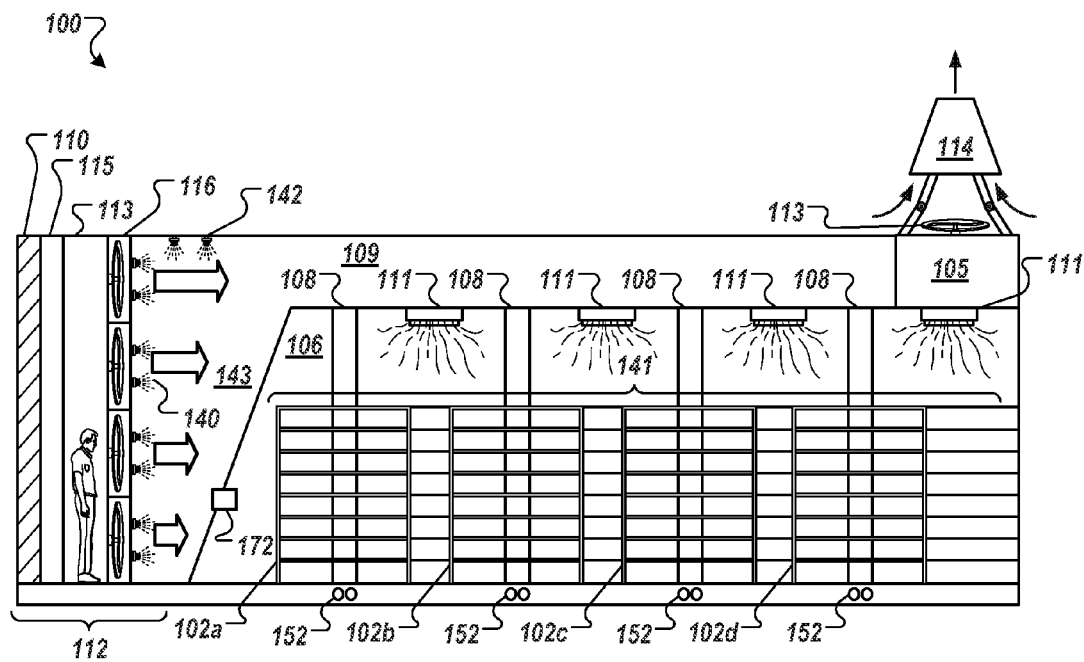
Figure 1B:
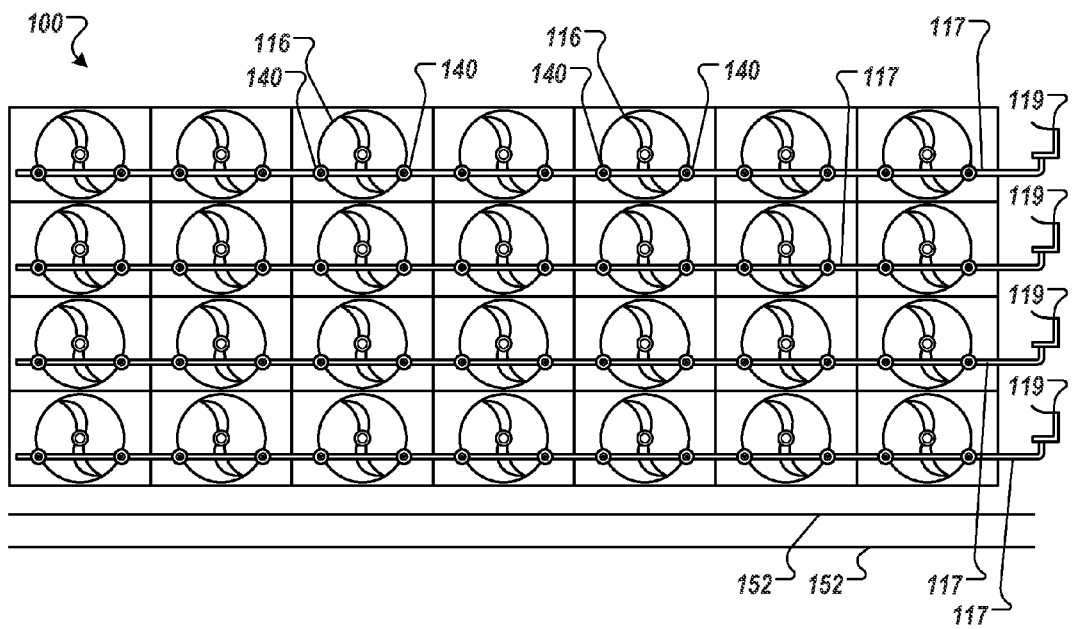
Figure 1C:
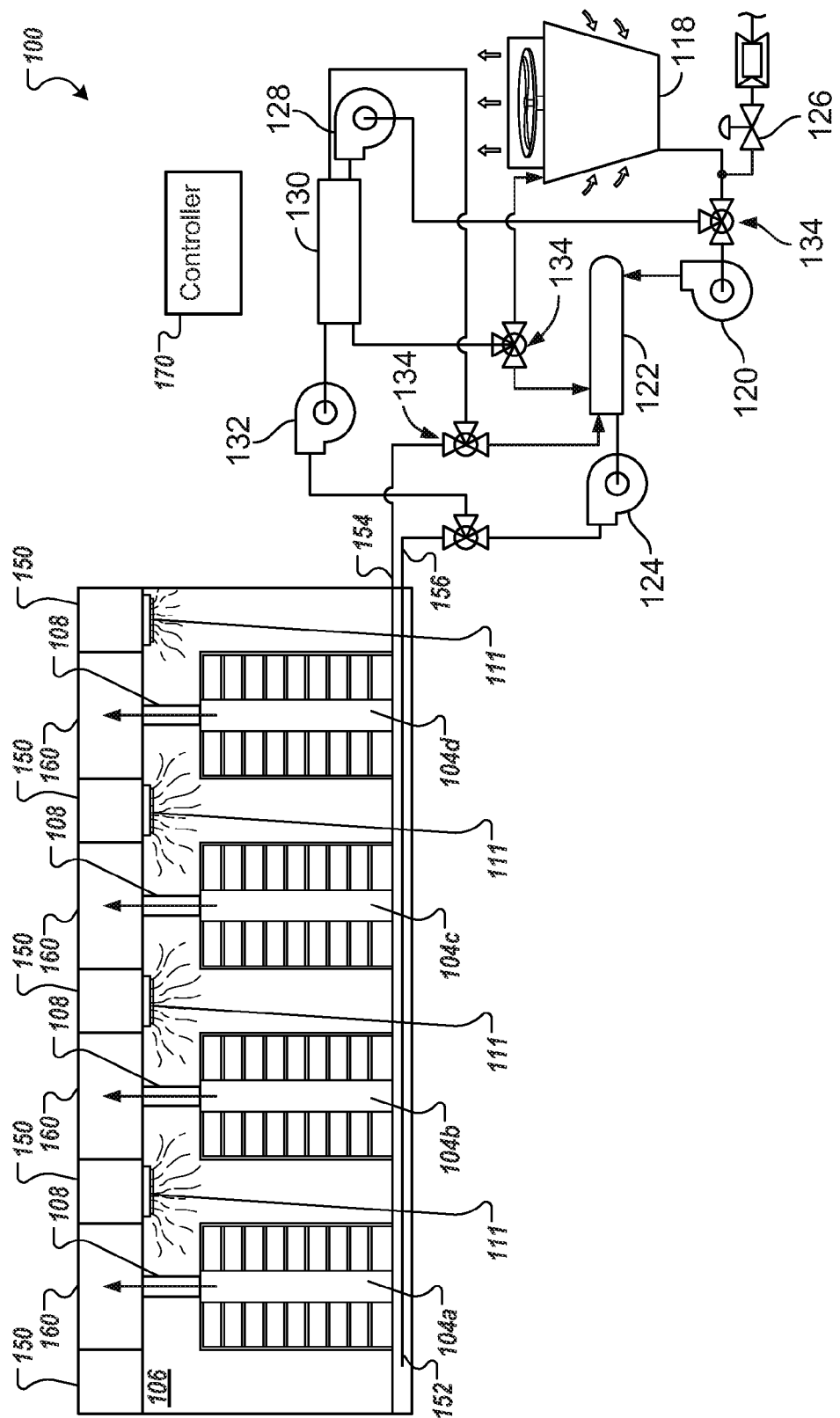

Referring to FIGS. 1A-1D, there is shown an example data center 100 in sectional view (though in partial schematic in FIG. 1D). The data center 100 is provided in a building that houses a large number of computers or similar heat-generating electronic components. A work space 106 is defined around the computers, which are arranged in a number of parallel rows and mounted in vertical racks, such as racks 102a, 102b, 102c, 102d, with human-occupiable aisles in the work space 106 between rows of racks. The region of the data center that includes the racks is referred to herein as the "rack zone" 141. The racks may include pairs of vertical rails to which are attached paired mounting brackets (not shown). Trays that contain computers, such as standard circuit boards in the form of motherboards, may be placed on the mounting brackets.

In the example implementation shown, a collection of fans 116 are positioned downstream of an opening in an exterior wall of the data center. The opening in the wall is covered by a set of louvers 110, e.g., architectural louvers that may be paired with powered dampers. The fans 116 draw outside air at outdoor ambient conditions into an entry zone 113 of the data center. A collection of atomizers 140, 142 are positioned downstream of the entry zone 113 and are arranged to spray atomized water into the outside air drawn into the data center. An evaporation zone 143 is provided where the atomized water evaporates and, while doing so, cools the outside air to a temperature that is closer to the wet bulb temperature for the air. The rack zone 141 is positioned downstream of the evaporation zone 143 and the cool air is directed into the rack zone 141. In the implementation shown, a filter section 115 is included downstream of the louvers 110 and before the fans 116 to filter the outside air before it is directed any further into the data center.

In the particular implementation shown, the cool air is directed (by the fans 116) into a cool air plenum 109 that includes several conduits 150 as shown in the plan view of the data center in FIG. 1D. The conduits are arranged above the rack zone 141 and extend substantially the distance across the rack zone, so as to form an attic area defined by a warm-air plenum and a cool air plenum 109 that are separate from the rack zone 141 by a ceiling of the rack zone 141. As is described further below, one or more diffusers, e.g., diffusers 111, can be included in the cool air plenum 109 to direct the cool air downwardly into the rack zone 141.

The cool air becomes heated air after exposure to the rack zone 141, such as by being circulated across motherboards or other components in the racks (e.g., from front sides of each rack to back sides of each rack). Referring to FIG. 1D, a hot air plenum 105 is in fluid communication with the rack zone 141 (e.g., via a hot air capture plenum that is located physically behind and between paired rows of back-to-back racks) and configured to capture hot air from the rack zone 141. The hot air plenum 105 can be served by several conduits 160 that are positioned above the rack zone 141 such that the heated air is routed upward into the hot air plenum 105 by chimney plenums 108.

In some implementations, the hot air plenum 105 may be served by one or more conduits positioned beneath, rather than above, the rack zone 141, wherein one or more fans may be configured to draw hot air from the rack zone 141 downwardly into the hot air plenum 105. Such conduits may be located in a raised floor, basement, or other appropriate space. The hot air may be gathered from the hot air plenum 105 by air handling units that include, for example, one or more fans appropriately sized for the task. Both the cool air plenum and the hot air plenum 105 may be located below the floor, each may be located on opposite sides of the rack zone, with one below the floor and the other above the ceiling, or vice-versa. Where the cool-air plenum is below the floor, outside air may be drawn in from a sub-basement located below the data center 100, and then the cool-air plenum is above the ceiling, outdoor air may be drawn in through the roof of the data center 100.

As such, the cooled outside air is provided to the work space 106, drawn through the racks 102a-102d such as by fans mounted on the many trays that are mounted in racks 102a-102d. This air may be heated as it passes over the trays and through power supplies running the computers on the trays, and may then be exhausted into a number of hot exhaust spaces 104a-104d. Each tray may have its own power supply and fan, with the power supply at the back edge of the tray, and the fan attached to the back of the power supply. All of the fans may be configured or programmed to deliver air at a single common temperature, such as at a set 113° F. (45° C.), so that the individual fans control their respective speeds to maintain an essentially equal temperature rise across the computers throughout the data center 100. The heated air is then routed through the hot exhaust spaces 104a-104d and the chimney plenums 108 to the hot air plenum 105, and exhausted to atmosphere through an exhaust 114, so that the outside air to be supplied to the computer does not mix with, and get diluted by, the warmed air from the computers.

Air is drawn through the louvers 110 and filters 115 by a collection of fans 116. In some implementations, the collection of fans 116 may cover an area that is substantially the same size as the opening in the outside wall of the data center 100. The fans may be propeller fans arranged in a grid where a large pressure rise is not needed, and high volumetric flow rate is more important. Other types of fans (e.g., centrifugal and in-line or axial flow) may also be used.

A number of water supply lines 117 carry water to a collection of water misters, or atomizers 140-142 that are spaced across the wall of fans 116. The atomizers 140 are located downstream from the fans 116 to spray a fine mist of water into the flow of air when the outside air is determined to be sufficiently warm and/or dry enough to evaporate the atomized water (when there is a sufficient distance between its wet bulb and dry bulb temperatures). The atomizers 142 are located above the flow of air, such that gravity will pull the mist into the flow of air below. As the atomized water evaporates, heat energy is drawn out of the air. The flow of water to the water supply lines 117 is controlled by a collection of atomizer flow controllers 119. Various examples of processes for controlling the atomizer flow controllers 119 and the evaporative cooling system 112 in general, will be discussed in the descriptions of FIGS. 3-5 and 8-10.

In some implementations, fresh air may be provided to the work space 106 by various other mechanisms. For example, a supplemental air-conditioning unit, such as a standard rooftop unit may be provided to supply necessary exchanges of outside air. Also, such a unit may serve to dehumidify the work space 106 for the limited latent loads in the data center 100, such as human perspiration (though direct evaporative cooling would not be used during such a time). In some implementations, the cool air may be provided to the work space 106 through plenums or other types of conduits that run below the floor of the work space 106, wherein the diffusers 111 may be configured to direct the cool air upwardly into the areas surrounding the racks 102a-102d (e.g., through a perforated floor).

The work space 106 may include heat loads other than the trays, such as from people in the space and lighting. Where the volume of air that passes through the various racks is very high and picks up a very large thermal load from multiple computers, the small additional load from other sources may be negligible, apart from perhaps a small latent heat load caused by workers, which may be removed by a smaller auxiliary air conditioning unit as described above.

In some implementations, the rack zone 141 may be cooled using the evaporative cooling system 112 (as described above), by cooling units cooled by a chiller system as will be described next, or a combination of both.

Referring again to the racks 102a-102d in FIG. 1A, in one example, the mounting brackets may be angled rails welded or otherwise adhered to vertical rails in the frame of a rack, and trays may include motherboards that are slid into place on top of the brackets, similar to the manner in which food trays are slid onto storage racks in a cafeteria, or bread trays are slid into bread racks. The trays may be spaced closely together to maximize the number of trays in a data center, but sufficiently far apart to contain all the components on the trays and to permit air circulation between the trays.

Other arrangements may also be used. For example, trays may be mounted vertically in groups, such as in the form of computer blades. The trays may simply rest in a rack and be electrically connected after they are slid into place, or they may be provided with mechanisms, such as electrical traces along one edge, that create electrical and data connections when they are slid into place.

Air may circulate from the work space 106 across the trays and into the hot exhaust spaces 104a, 104b, 104c, and 104d behind the trays. The air may be drawn into the trays by fans mounted at the back of the trays (not shown). The fans may be programmed or otherwise configured to maintain a set exhaust temperature for the air into the warm air plenum, and may also be programmed or otherwise configured to maintain a particular temperature rise across the trays. Where the temperature of the air in the work space 106 is known, controlling the exhaust temperature also indirectly controls the temperature rise. The regions between the racks 102a-102d exposed to the cool air of the work space 106 may, in certain circumstances, be referenced as "cold aisles," and the hot exhaust spaces 104a-104d as "warm aisles."

In operation, then, circulating air may enter the fronts of the racks 102a-102d from the work space 106, may pass across heated components in the racks 102a-102d, such as microprocessors and memory chips, and may be exhausted out of the back of the racks into cooling units (not shown), so that each cooling unit receives heated exhaust air from racks on opposed sides. (Where cooling units proximate to the rows of racks are used, cooled air may be recirculated through the work space and may be blended with outside air that has received direct evaporative cooling.) The cooling units may be provided with air circulating equipment such as fans and cooling equipment such as cooling coils, so that air is drawn through the coils and exhausted in a cooled state back into the data center work space 106 or into a collection of chimney plenums 108.

In some examples, warm air that passes through the racks may be drawn upward into the hot air plenum 105. In another implementation, air may enter a warm air plenum behind the computers and be drawn by fans down into an under-floor space (e.g., below a real or false floor), where it may be gathered, circulated through cooling coils, and delivered back into the workspace, such as through perforated floor plates, or may not be cooled and may be exhausted form the data center 100, or some may be cooled and blended with outdoor make-up air that has been direct evaporative cooled.

The cooling units may be individual units that are configured in a row and brought into close contact with the computing racks. In some examples, two rows of computers may be installed in the data center 100, where each row contains computing racks sandwiched on each side of corresponding cooling units. In one example, each rack may be approximately five feet wide (having three bays of computers per rack), and six to eight feet, or 14 or more feet high.

Also where cooling units are provided adjacent to the racks, a collection of cooling loops 152, in the form of additional piping, can also be included and connected to headers 154, 156 in preparation for installing computing racks above the respective loops. Although vertical positioning is not discernible in this figure, the cooling loop 152 may be located below the level of the computer racks, as may cooling loops for the particular computing racks that are shown here, where those additional cooling loops are not visible in the figure. For example, the cooling loops may be located below a raised floor in a facility, or may be located in a ceiling space of a level that is below the level where the computing racks are located. Similarly, the cooling loop may be located above the computer units, though such location may raise issues with respect to leaking water impinging on the computer racks. Cooling loop 152 may also be located within or adjacent to the cooling units.

The temperature rise of the air flowing across the trays can be large. For example, the work space 106 temperature may be about 77° F. (25° C.) and the exhaust temperature into the hot exhaust spaces 104a-104d may be set to 113° F. (45° C.), for a 36° F. (20° C.)) rise in temperature. The exhaust temperature may also be as much as 212° F. (100° C.) where the heat generating equipment can operate at such elevated temperature. For example, the temperature of the air exiting the equipment and entering the warm-air plenum may be 118.4, 122, 129.2, 136.4, 143.6, 150.8, 158, 165, 172.4, 179.6, 186.8, 194, 201, or 208.4° F. (48, 50, 54, 58, 62, 66, 70, 74, 78, 82, 86, 90, 94, or 98° C.). Such a high exhaust temperature generally runs contrary to teachings that cooling of heat-generating electronic equipment is best conducted by washing the equipment with large amounts of fast-moving, cool air. Such a cool-air approach does cool the equipment, but it also uses lots of energy.

Cooling of particular electronic equipment, such as microprocessors, may be improved even where the flow of air across the trays is slow, by attaching impingement fans to the tops of the microprocessors or other particularly warm components, or by providing heat pipes and related heat exchangers for such components.

Cooling water for the cooling loops 152 may be provided from a cooling water circuit powered by pump 124. The cooling water circuit may be formed as a direct-return, or indirect-return, circuit, and may generally be a closed-loop system. Pump 124 may take any appropriate form, such as a standard centrifugal pump. Heat exchanger 122 may remove heat from the cooling water in the circuit. Heat exchanger 122 may take any appropriate form, such as a plate-and-frame heat exchanger or a shell-and-tube heat exchanger.

Heat may be passed from the cooling water circuit to a condenser water circuit that includes heat exchanger 122, pump 120, and cooling tower 118. Pump 120 may also take any appropriate form, such as a centrifugal pump. Cooling tower 118 may be, for example, one or more forced draft towers or induced draft towers. The cooling tower 118 may be considered a free cooling source, because it requires power only for movement of the water in the system and in some implementations the powering of a fan to cause evaporation; it does not require operation of a compressor in a chiller or similar structure. The cooling by the towers may be considered indirect evaporative cooling because the evaporation does not occur in air that has or will enter the data center 100 building, while the other evaporative cooling may be referred to as direct evaporative cooling. By using an electronic control system, and depending on the conditions (e.g., outdoor wet and dry bulb temperatures, and heat load in the building), either of the evaporative cooling sources may be used, or the two may be used simultaneous and in varying proportions to each other.

The cooling tower 118 may take a variety of forms, including as a hybrid cooling tower. Such a tower may combine both the evaporative cooling structures of a cooling tower with a water-to-water heat exchanger. As a result, such a tower may be fit in a smaller face and be operated more modularly than a standard cooling tower with separate heat exchanger. An additional advantage may be that hybrid towers may be run dry, as discussed above. In addition, hybrid towers may also better avoid the creation of water plumes that may be viewed negatively by neighbors of a facility.

As shown, the fluid circuits may create an indirect water-side economizer arrangement. This arrangement may be relatively energy efficient, in that the only energy needed to power it is the energy for operating several pumps and fans. In addition, this system may be relatively inexpensive to implement, because pumps, fans, cooling towers, and heat exchangers are relatively technologically simple structures that are widely available in many forms. In addition, because the structures are relatively simple, repairs and maintenance may be less expensive and easier to complete. Such repairs may be possible without the need for technicians with highly specialized knowledge.

Alternatively, direct free cooling may be employed, such as by eliminating heat exchanger 122, and routing cooling tower water (condenser water) directly to cooling coils (not shown) Such an implementation may be more efficient, as it removes one heat exchanging step. However, such an implementation also causes water from the cooling tower 118 to be introduced into what would otherwise be a closed system. As a result, the system in such an implementation may be filled with water that may contain bacteria, algae, and atmospheric contaminants, and may also be filled with other contaminants in the water. A hybrid tower, as discussed above, may provide similar benefits without the same detriments.

Control valve 126 is provided in the condenser water circuit to supply make-up water to the circuit. Make-up water may generally be needed because cooling tower 118 operates by evaporating large amounts of water from the circuit. The control valve 126 may be tied to a water level sensor in cooling tower 118, or to a basin shared by multiple cooling towers. When the water falls below a predetermined level, control valve 126 may be caused to open and supply additional makeup water to the circuit. A back-flow preventer (BFP) may also be provided in the make-up water line to prevent flow of water back from cooling tower 118 to a main water system, which may cause contamination of such a water system.

Optionally, a separate chiller circuit may be provided. Operation of system 100 may switch partially to this circuit, which can be used in combination with the evaporation cooling system 112. During times of extreme atmospheric ambient (i.e., hot and humid) conditions or times of high heat load in the data center 101 the chiller circuit may be used exclusively. Controlled mixing valves 134 are provided for electronically switching to the chiller circuit, or for blending cooling from the chiller circuit with cooling from the condenser circuit. Pump 128 may supply tower water to chiller 130, and pump 132 may supply chilled water, or cooling water, from chiller 130 to the remainder of system 100. Chiller 130 may take any appropriate form, such as a centrifugal, reciprocating, or screw chiller, or an absorption chiller.

The chiller circuit may be controlled to provide various appropriate temperatures for cooling water. In some implementations, the chilled water may be supplied exclusively to a cooling coil, while in others, the chilled water may be mixed, or blended, with water from heat exchanger 122, with common return water from a cooling coil to both structures. The chilled water may be supplied from chiller 130 at temperatures elevated from typical chilled water temperatures. For example, the chilled water may be supplied at temperatures of 55° F. (13° C.) to 65 to 70° F. (18 to 21° C.) or higher. The water may then be returned at temperatures like those discussed below, such as 59 to 176° F. (15 to 80° C.). In this approach that uses sources in addition to, or as an alternative to, free cooling, increases in the supply temperature of the chilled water can also result in substantial efficiency improvements for the data center 100.

Pumps 120, 124, 128, 132, may be provided with variable speed drives. Such drives may be electronically controlled by a central control system to change the amount of water pumped by each pump in response to changing set points or changing conditions in the data center 100. For example, pump 124 may be controlled to maintain a particular temperature in the rack zone 141, such as in response to signals from a thermostat or other sensor in the rack zone 141.

The system can include a controller 170. The controller 170 can be a computer system configured to receiving readings from various sensors placed about the data center 100 and respond to the sensed values by altering the operation of the evaporative cooling system (e.g., changing atomizer flow rates, louver positions, fan speeds), For example, in operation, the controller 170 can be in controllable communication with cooling systems of the data center 100, and can respond to signals from various sensors placed in the data center 100. The sensors may include, for example, thermostats, humidistats, flowmeters, and other similar sensors. In one implementation, one or more thermostats may be provided in the hot exhaust spaces 104a-104d, and one or more thermostats may be placed in the rack zone 141. In addition, air pressure sensors may be located in work space 106, and in the conduits 160. The sensors can be used by the controller 170 to determine whether to use the evaporative cooling system 112 exclusively, in combination with one or more of the other cooling systems described (or others), or not at all. For example, a thermostat 172 may be used by the controller 170 to sense the temperature differential at the boundary of the evaporation zone 143 and the work space 106 to control the speed of associated pumps, so that if temperature begins to rise, the pumps turn faster to provide additional cooling waters. Pressure sensors may also be used by the controller 170 to control the speed of various items such as fans 113 and 116 to maintain a set pressure differential between two spaces, such as that attic 105 and the rack zone 141, and to thereby maintain a consistent airflow rate. Where mechanisms for increasing cooling, such as speeding the operation of pumps, are no longer capable of keeping up with increasing loads, the controller 170 may activate the chiller 130 and associated pumps 128, 132, and may modulate control valves 134 accordingly to provide additional cooling.

Various values for temperature of the fluids in data center 100 may be used by the controller 170 in the operation of data center 100. In one exemplary implementation, the temperature setpoint in the hot exhaust spaces 104a-104d may be selected to be at or near a maximum exit temperature for trays in racks 102a-102d. This maximum temperature may be selected, for example, to be a known failure temperature or a maximum specified operating temperature for components in the trays, or may be a specified amount below such a known failure or specified operating temperature. In certain implementations, a temperature of 45° C. may be selected. In other implementations, temperatures of 25° C. to 125° C. may be selected. Higher temperatures may be particularly appropriate where alternative materials are used in the components of the computers in the data center, such as high temperature gate oxides and the like.

In one implementation, supply temperatures for cooling water may be 68° F. (20° C.), while return temperatures may be 104° F. (40° C.). In other implementations, temperatures of 50° F. to 84.20° F. or 104° F. (10° C. to 29° C. or 40° C.) may be selected for supply water, and 59° F. to 176° F. (15° C. to 80° C.) for return water. Chilled water temperatures may be produced at much lower levels according to the specifications for the particular selected chiller. Cooling tower water supply temperatures may be generally slightly above the wet bulb temperature under ambient atmospheric conditions, while cooling tower return water temperatures will depend on the operation of the data center 100.

Using these parameters and the parameters discussed above for entering and exiting air, relatively narrow approach temperatures may be achieved with the data center 100. The approach temperature, in this example, is the difference in temperature between the air leaving a coil and the water entering a coil. The approach temperature will always be positive because the water entering the coil is the coldest water, and will start warming up as it travels through the coil. As a result, the water may be appreciably warmer by the time it exits the coil, and as a result, air passing through the coil near the water's exit point will be warmer than air passing through the coil at the water's entrance point. Because even the most-cooled exiting air, at the cooling water's entrance point, will be warmer than the entering water, the overall exiting air temperature will need to be at least somewhat warmer than the entering cooling water temperature.

Keeping the approach temperature small permits a system to be run on free, or evaporative, cooling for a larger portion of the year and reduces the size of a needed chiller, if any is needed at all. To lower the approach temperature, the cooling coils may be designed for counterflow rather than for self-draining. In counter-flow, the warmest air flows near the warmest water and the coolest air exits near where the coolest water enters.

In certain implementations, the entering water temperature may be 64° F. (18° C.) and the exiting air temperature 77° F. (25° C.), as noted above, for an approach temperature of 12.6° F. (7° C.). In other implementations, wider or narrower approach temperature may be selected based on economic considerations for an overall facility.

Figure 2:
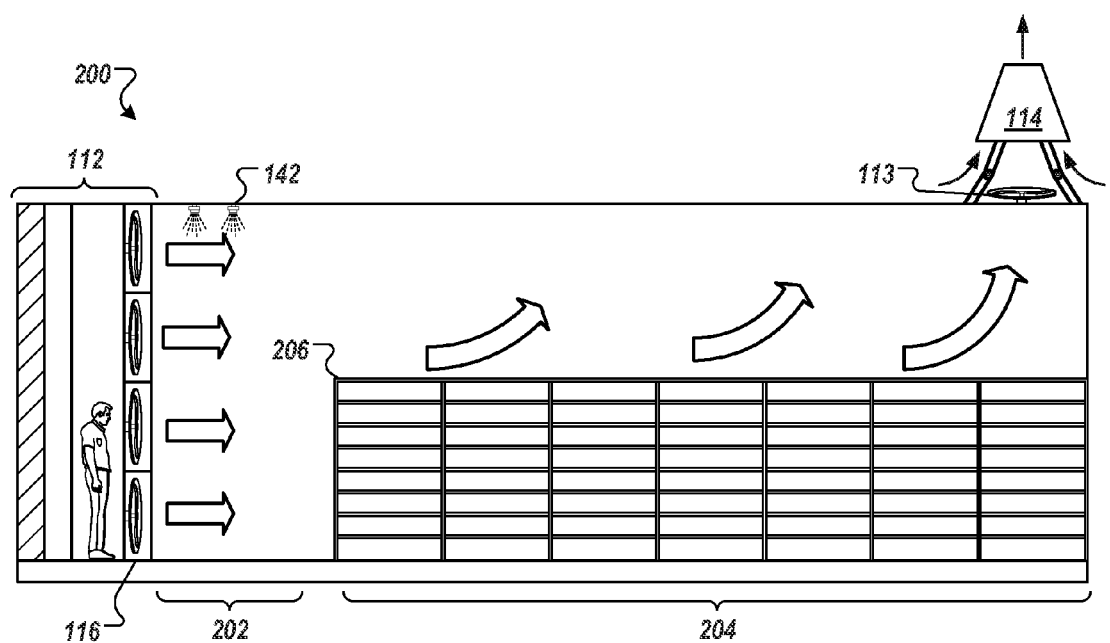
FIG. 2 is a side view of another example data center that can utilize evaporative cooling.

Referring now to FIG. 2, an example data center 200 implements an alternative embodiment of evaporative cooling. In the example data center 100 of FIGS. 1A-1D, outside air is drawn by the fans 116 and routed to the rack zone 141 through the cool air plenum 109 plenum. However, in the example of the data center 200, the outside air is evaporatively cooled and is then passed directly into a rack zone 204 of the data center 200.

Outside air is drawn by the fans 116 into an evaporation zone 202. Within the evaporation zone 202, atomized water is introduced into the air by the atomizers 142 and allowed to evaporate thereby cooling the air. In some embodiments, the evaporation zone 202 may provide a volume of space that is sufficient to allow the atomized water to evaporate substantially completely, such that liquid water does not enter the rack zone 204.

The cooled air is allowed to flow substantially freely (e.g., the air is generally not routed through plenums) into the rack zone 204. The cooled air flows among, through, and out of a rack zone 204 that includes a collection of rows of racks 206 where the air is warmed. The warmed air is then returned to the outside through an exhaust 114. In some implementations, the warmed air may be drawn into an exhaust plenum located beneath the floor of the data center, where the warmed air may be routed outdoors.

In some embodiments, the data center 200 may be oriented such that the evaporative cooling system 112 faces in the general direction of naturally prevailing winds. For example, by orienting the data center 200 substantially along the direction of the prevailing winds, naturally occurring outdoor breezes may help cause cool air to flow into, through and out of the data center, and reduce the need for power to operate the fans 113 and 116.

It should be understood that the evaporative cooling system described in reference to FIG. 2 can be used in combination with one or more other cooling systems, similar to the evaporative cooling system described above in reference to FIGS. 1A-D.

Figure 3:
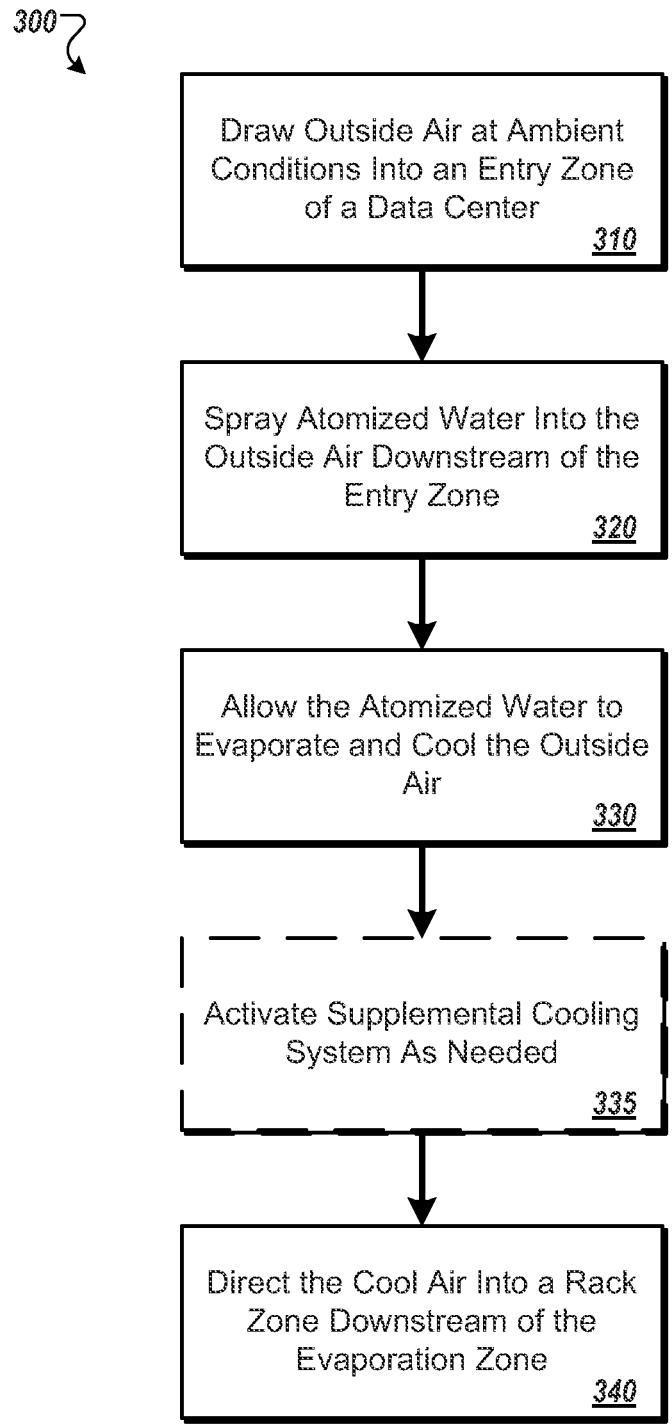
FIG. 3 is a flow diagram of an example process for using direct evaporative cooling in a data center.

FIG. 3 is a flow diagram of an example process 300. In general, the process 300 is a process executed by a controller for cooling a data center, such as the data center 100 or 200, by providing evaporatively cooled outdoor air to flow substantially directly into the data center (with or without using a cool air plenum), such as is discussed in description of FIGS. 1A-D and 2. The process 300 begins when outside air is drawn (310) into an entry zone of the data center. In some implementations, the entry zone may include such things as the louvers 110, shutters, or other similar structures that may be used to selectively allow or prevent the flow of outside air, and may also include the filters 115 and the fans 116.

Atomized water is sprayed (320) into the drawn outside air at a location downstream of the entry zone. For example, a mist of water may be produced by the atomizers 140 and/or 142 at or near the outlets of the fans 116. The atomized water is allowed to evaporate in an evaporation zone and thereby cool the drawn outside air (330). In some implementations, the evaporation zone may be a space in which the sprayed atomized water and drawn air can mix long enough to allow the water to evaporate. For example, the evaporation zone may be the evaporation zone 143 or 202.

Optionally, a supplemental cooling system may be activated (335) as needed. For example, some outdoor environmental conditions (e.g., outdoor air with very high relative humidity) may limit how effectively the evaporative cooling system 112 may be able to cool the data center 100. To supplement the cooling effect provided by the evaporative cooling system 112, a supplemental cooling system including the components 118-134 (e.g., chillers, cooling towers, heat exchangers, pumps) may be optionally engaged to further cool the air in the data center 100.

The cool air is directed into a rack zone that is downstream of the evaporation zone (340). In some implementations, the cool air may be drawn through the racks to absorb heat that is generated by the computers in the racks, and is then exhausted outside of the data center. In some implementations, e.g., as described in reference to FIGS. 1A-D, the cool air is directed into a cool air plenum and then directed into the rack zone 141 by one or more diffusers 111. In other implementations, e.g., as described in reference to FIG. 2, the cool air is directed into the rack zone 204 without using a cool air plenum.

In some implementations, the process 300 may be used in addition to, or in conjunction with, processes for controlling data center temperatures using a supplemental cooling system. For example, cooling towers, water-to-water, air-to-air and/or air-to-water heat exchangers, chillers, and/or other equipment may be used to supplement the cooling provided by an evaporative cooling system controlled by the process 300. In some implementations, a controller executing the steps of the process 300 may selectively activate a supplemental cooling system based on the measurements and on the temperature and relative humidity set points for the rack zone.

Figure 4:
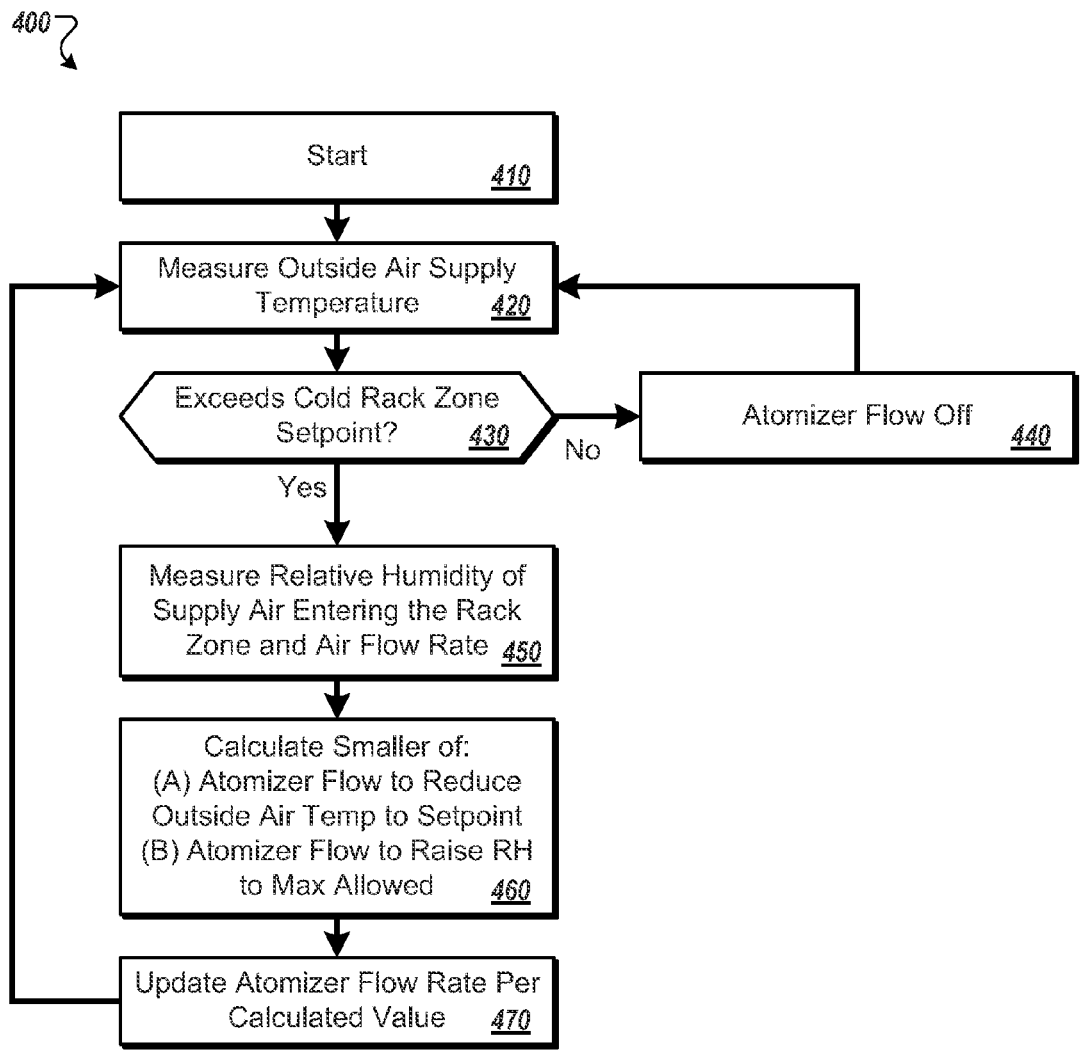
FIG. 4 is a flow diagram of an example metered process for controlling evaporative cooling in a data center.

FIG. 4 shows a flow diagram of an example process 400. Generally speaking, the process 400 describes the control of a metered water flow to a collection of atomizers in an evaporative cooling system in which the cooled air is allowed to flow substantially freely into a data center (with or without the use of a cool air plenum), such as the data center 100 of FIGS. 1A-D or the data center 200 of FIG. 2. In some implementations, the process 400 may be performed by the controller 170. In some implementations, the process 400 may be used in the step 320 of the process 300.

The process 400 starts (410) and the temperature of the outside air supply is measured (420). The temperature measurement is used to determine (430) if the temperature exceeds the cold rack zone setpoint. If the temperature does not exceed the cold rack zone setpoint, then the atomizer flow is turned off, (440) and the outside air temperature is measured (420) again. If the temperature exceeds the cold rack zone setpoint, then the relative humidity of the supply air entering the rack zone, as well as the air flow rate, is measured (450). For example, if the air outside is already cooler than what is needed to cool the data center, then no evaporation is used to cool the air any further. In some implementations, the temperature and humidity may be measured using devices such as thermometers and humidistats.

The smaller of (A) the atomizer flow to reduce the outside air temperature to the setpoint, or (B) the atomizer flow to raise the relative humidity to the maximum allowed, is calculated (460). The calculated value is then used to update (470) the atomizer flow rate. Under some conditions, such as very high outside temperatures and/or relative humidities, the evaporative cooling system may not provide sufficient cooling even when the atomizer rate is at its substantially maximum flow rate. In some implementations, additional cooling beyond the capacity of the evaporative cooling system may be provided by activating a supplemental cooling system. The flow rate is based on the atomizer flow rate, the measured air temperature, the measured relative humidity, and the rack zone temperature and humidity set points. Once the flow rate is updated (470), the outside air supply temperature is measured (420) once again, and the cycle continues.

Figure 5:
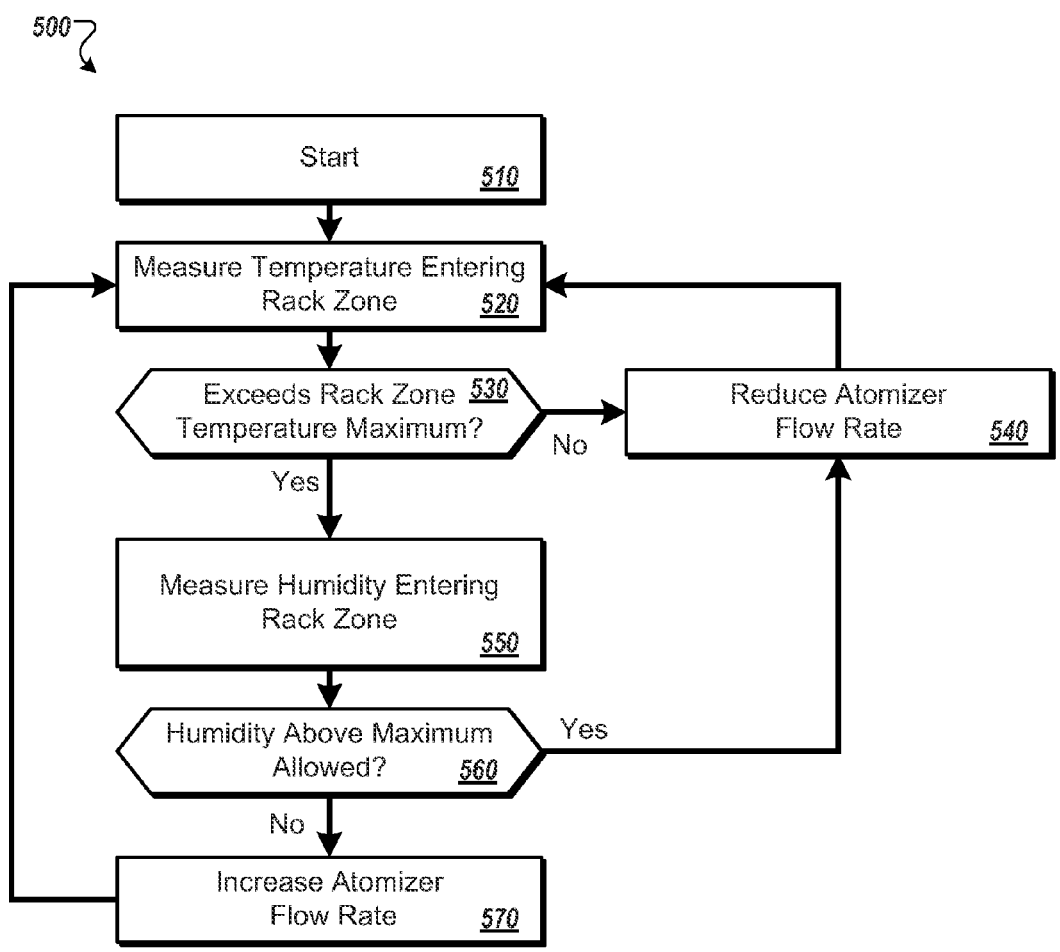
FIG. 5 is a flow diagram of an example feedback-based process for controlling evaporative cooling in a data center.

FIG. 5 is a flow diagram of an example process 500. In general, the process 500 describes the feedback-fed control of water flow in an evaporative cooling system in which the cooled air is allowed to flow substantially freely into a data center (with or without a cool air plenum), such as the data center 100 (FIGS. 1A-D) or data center 200 (FIG. 2). In some implementations, the process 500 may be performed by the controller 170. In some implementations, the process 500 may be used in the step 320 of the process 300.

The process 500 starts (510) and the temperature of the air entering the rack zone is measured (520), for example with a thermometer, and if the temperature is determined (530) to not exceed the rack zone temperature maximum, then the atomizer flow rate is reduced (540). Otherwise, if the temperature is determined (530) to exceed the rack zone temperature maximum, then the humidity of the air entering the rack zone is measured (550). For example, a humidistat may be used to measure the humidity of the air.

If the humidity is determined (560) to be above the maximum humidity level allowed, then the atomizer flow rate is reduced (540). Otherwise, if the humidity is determined (560) not to be above the maximum humidity level allowed, then the atomizer flow rate is increased (570). Under some conditions, such as very high outside temperatures and/or relative humidities, the evaporative cooling system may not provide sufficient cooling even when the atomizer flow rate is at its substantially maximum flow rate. In some implementations, additional cooling beyond the capacity of the evaporative cooling system may be provided by activating a supplemental cooling system. The atomizer flow rate is varied based on the previous atomizer flow rate, the measured air temperature, the measured relative humidity, and the rack zone temperature and humidity set points. The temperature of the air entering the rack zone is then measured (520) again.

Figure 6:
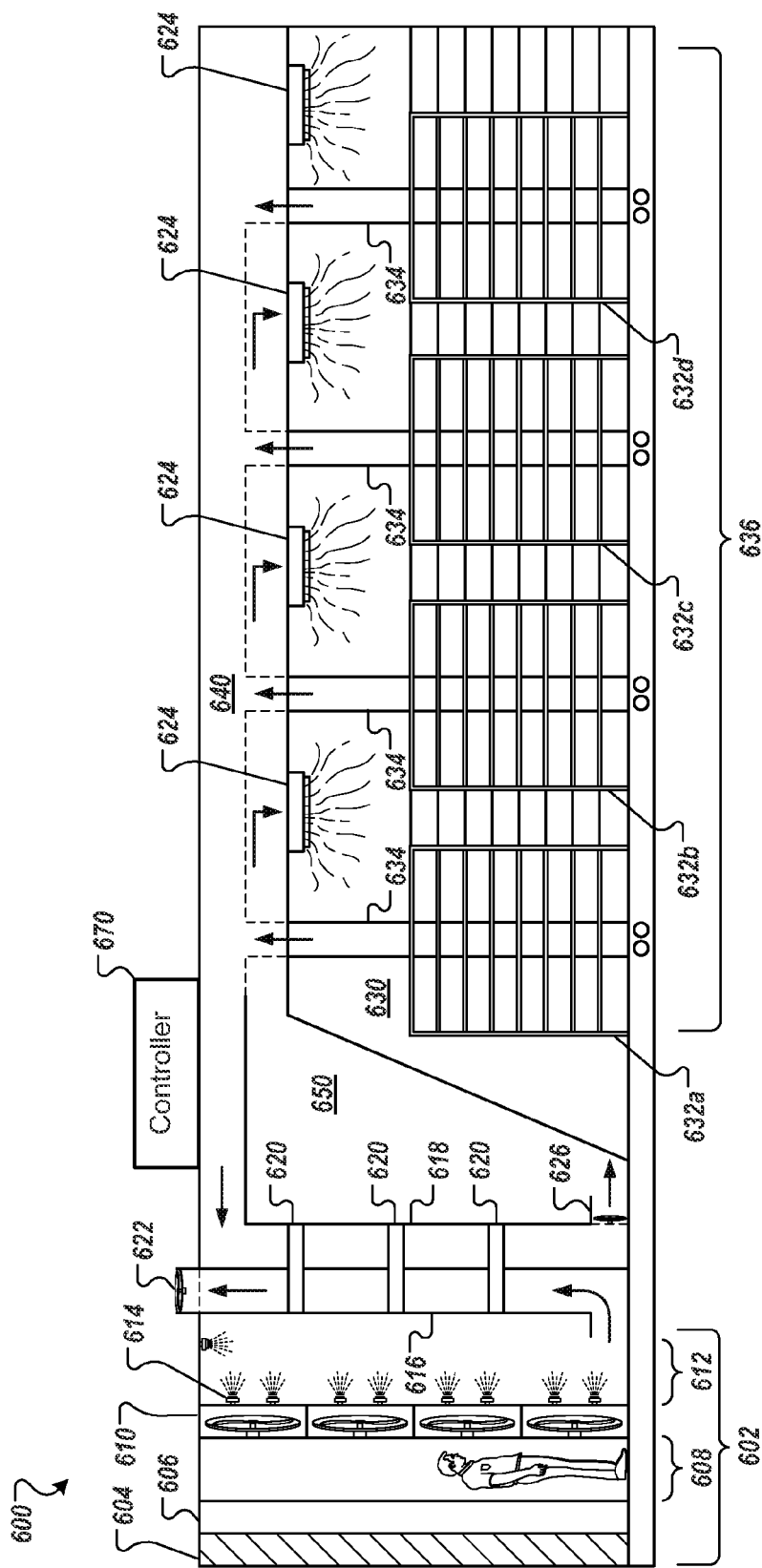
FIG. 6 is a side view of an example data center that implements air-to-air heat exchangers and evaporative cooling.

Referring now to FIG. 6, an example data center 600 implements a combination of evaporative cooling and heat exchangers. Generally speaking, the data center 600 is configured in a manner similar to the data center 100 of FIGS. 1A-1D, except that that the racks of computers are not substantially exposed to the evaporatively cooled outside air. Instead, the evaporatively cooled outside air is used to cool the warm indoor air through heat exchangers. In some implementations, keeping the outside and indoor air substantially separated may be desirable when, for example, the outdoor air is generally dirty at the data center's location (e.g., a dusty desert location, a smoggy urban location, a pollen-rich rural area).

The data center includes an evaporative cooling system 602 controlled by a controller 670. In some implementations, the evaporative cooling system 602 may be the evaporative cooling system 112. In some implementations, the controller 670 may be a computer configured to receiving readings from various sensors placed about the data center 600 (e.g., thermostats, humidistats, flow sensors, pressure transducers) and respond to the sensed values by altering the operation of the evaporative cooling system 602 (e.g., changing atomizer flow rates, louver positions, fan speeds), In some implementations, the controller 670 may be substantially similar in function to the controller 170 of FIG. 1.

A set of louvers 604 are selectively opened to permit outside air to flow through the louvers 604 and a filter 606 into an entry zone 608. A collection of fans 610 draw the air from the entry zone 608 to an evaporation zone 612. Within the evaporation zone 612, a collection of atomizers 614 controllably sprays atomized water into the drawn air. As the atomized water evaporates, heat energy is drawn out of, and thereby cools, the air within the evaporation zone 612. The cooled outside air is passed through an outside air plenum 616 that substantially intersects with one or more heat exchangers 620, and is finally exhausted back to the outside by an exhaust fan 622.

A workspace 630 is defined around a number of parallel rows of computers mounted in vertical racks, such as racks 632a, 632b, 632c, 632d included in a rack zone 636. Air may circulate from the workspace 630 across the trays and into hot exhaust spaces behind the trays (not shown). As the air flows across the trays, the air absorbs heat that is generated by the computers thereby cooling the trays and heating the air. The heated air may be routed upward into a hot air plenum 640, by chimney plenums 634, or into a raised floor or basement, or other appropriate space, and may be gathered there by air handling units that include, for example, one or more fans appropriately sized for the task.

A circulation fan 626 draws the heated air through the hot air plenum to an indoor air plenum 618 that substantially intersects with the heat exchangers 620. As the heated indoor air passes though the heat exchangers 620, heat energy from the heated air is transferred to the cooled outdoor air. In other words, the cool outdoor air is heated by cooling the hot indoor air without substantial mixing of the indoor and outdoor air.

The cooled indoor air is then drawn through the fan 626 into a cool air plenum 650. The cool air plenum 650 routes the cooled indoor air to one or more diffusers, e.g., diffusers 624 such that the cooled indoor air is distributed into the rack zone 636 and throughout the work space 630.

In some implementations, the heat exchangers 620 can be air-to-air heat exchangers. In a particular example, the air-to-air heat exchangers are heat wheel heat exchangers. In the example shown, there are three heat exchangers 620 arranged in series. In other implementations, more or less heat exchangers can be used and they can be positioned in series or in other configurations relative to each other.

Figure 7B:
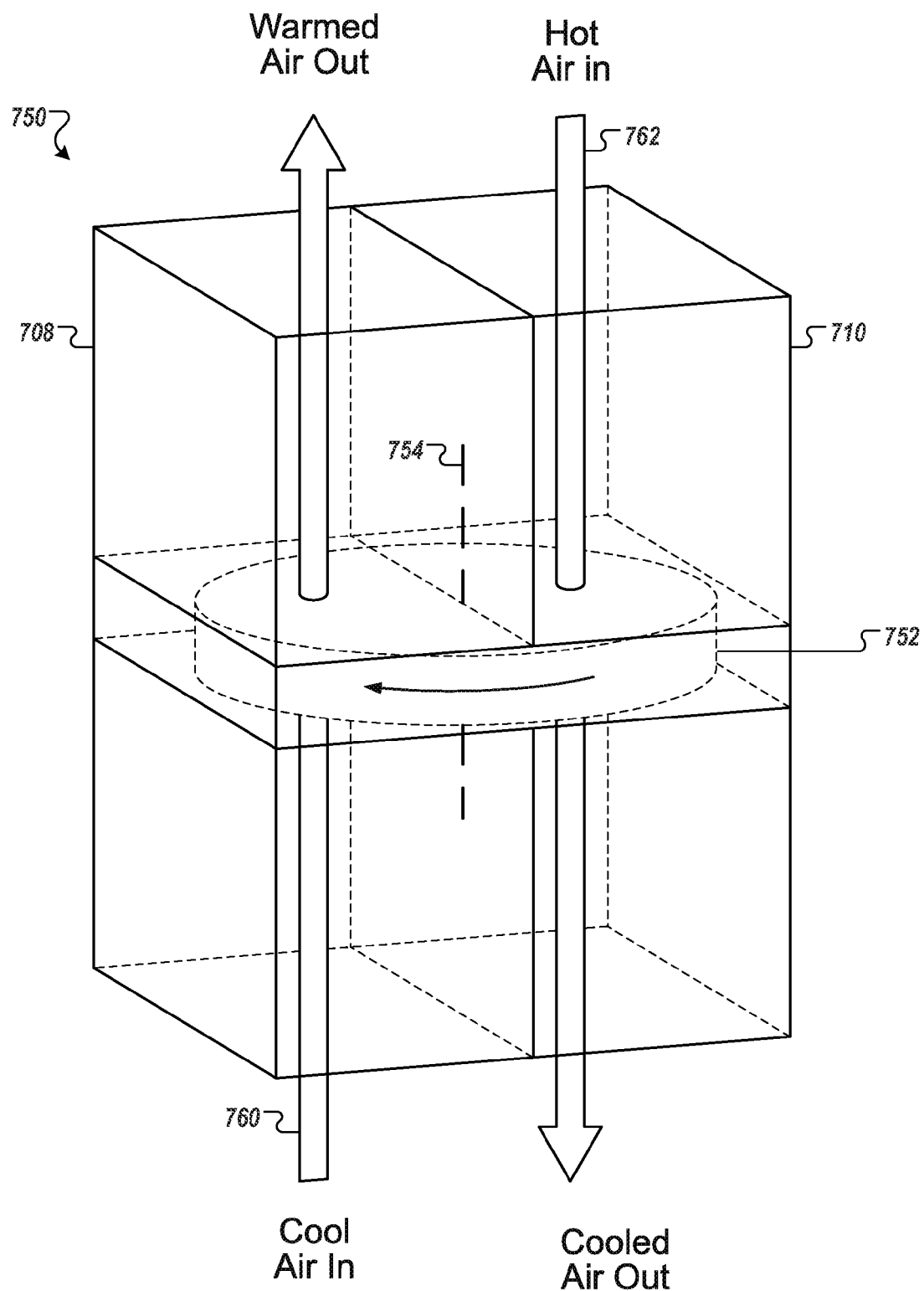

FIGS. 7A and 7B provide a close-up view of an example evaporative cooling system 700 that can be the evaporative cooling system 602 of FIG. 6. In this example, the heat exchangers 620 are air-to-air heat wheel exchangers 750. It should be understood however, that other forms of heat exchangers can be used. The evaporative cooling system 700 includes a number of fans 702 and a collection of atomizers 704. Outside air is drawn through the fans 702 into an evaporation zone 706. Within the evaporation zone 706, a controlled atomized mist of water provided by the atomizers 704 is evaporated. As the water evaporates, the outside air is cooled. Example processes for controlling the evaporative cooling of air using heat exchangers is discussed in the descriptions of FIGS. 8-10.

The cooled outside air flows into an outside air plenum 708 that substantially intersects with the heat exchangers 750. The heat exchangers 750 also substantially intersect an indoor air plenum 710. The indoor air plenum 710 carries hot air from the data center and through the heat exchangers 750. The heat exchangers 750 transfer heat energy from the hot indoor air to the cooled outside air, thereby cooling the indoor air and heating the outside air. In some implementations, since the outside air may be substantially isolated from a work space (e.g., the work space 630 of FIG. 6), this form of cooling may be referred to as "indirect" cooling.

The heated outside air is exhausted to the outdoors by a vent 712 that, in some embodiments, may include a vent fan 714. The cooled indoor air is drawn out to the data center by a fan 716. In some implementations, the flow of air to the data center may be measured by a flow meter. In some implementations, the cooled air may be cooled further by evaporatively cooling the air with a controllable water mist provided by a collection of atomizers 718 within a misting evaporation zone 720.

In the example of the evaporative cooling system 700, the heat exchangers 750 implement a technology referred to as "heat wheels". Generally speaking, a heat wheel is a rotary heat exchanger that operates on the air-to-air principle of heat transfer. It can provide a way of recovering air conditioning energy in hot, humid climates. Heat wheels can improve air-side economization (e.g., free cooling, the use of outside air to cool servers in the data center). Rather than introducing exterior air directly into the data center, the heat wheel briefly mixes the outside air and exhaust air to create an "air-to-air" heat exchanger. Some examples of heat wheels that may be used in various implementations of the evaporative cooling system 700 are the "TC" and "TF" series "Thermowheel" heat wheel products available from Thermotech Enterprises, Inc. of Tampa, Fla.

Referring now to FIG. 7B, one of the heat exchangers 750 is shown in additional detail. A heat wheel 752 rotates about an axis 754. Cool (and in some situations, dry) outside air 760 enters one side of the rotating heat wheel 752 and passes through a heat transfer media (not shown), chilling the heat wheel 752. In some implementations, the heat transfer media may be coated with a desiccant, and the cool exhaust air 760 may flow over the heat transfer media, thereby drying the desiccant. This cool and/or dry part of the heat wheel 752 then rotates into a supply of indoor air 762 where it absorbs heat, and in some implementations humidity, from the hot indoor air 762. In some implementations, the heat wheel 752 may cool the indoor air 762 without allowing the indoor air 762 and the outside air 760 to substantially mix. In some implementations, the heat wheel 752 may include a heat transfer media, e.g., made out of corrugated aluminum foil with a high surface area per volume and laminar flow. In some implementations, dry particles (e.g., up to 900 microns) may pass freely through the media. In some implementations, the heat transfer media may be supplied with a "Balanced Sieve" (e.g., 3 Å or 4 Å molecular sieve) hygroscopic solid desiccant coating for selective adsorption of water vapor and substantially equal sensible and latent heat transfer. In some implementations, the edges of the heat transfer media may include an anti-corrosion epoxy coating.

Figure 8:
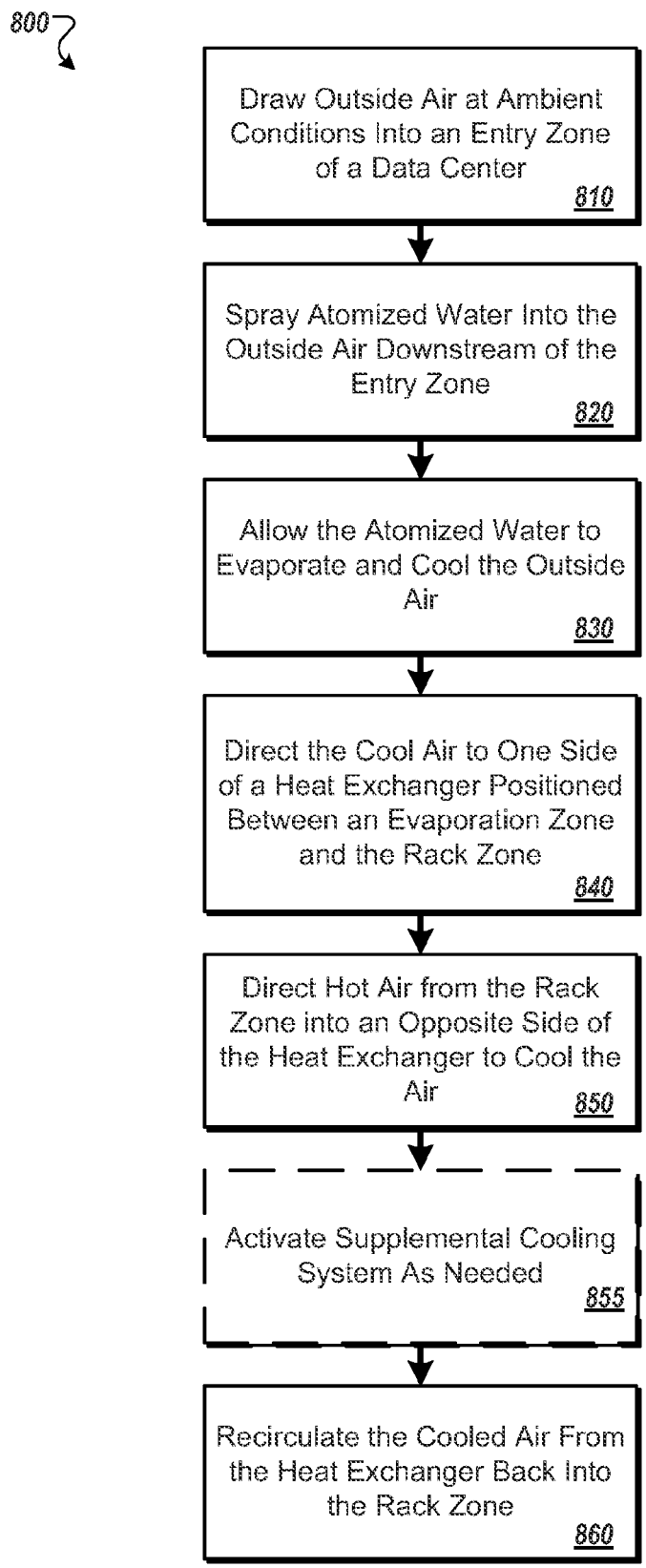
FIG. 8 is a flow diagram of an example process for using indirect evaporative cooling in a data center.

Referring now to FIG. 8, a process 800 is illustrated as a flow diagram. In general, the process 800 describes how evaporative cooling may be used for the indirect cooling of a data center (e.g., cooling though the use of heat exchangers such as heat wheels). In some implementations, the process 800 may be used by a controller (e.g., the controller 170 of FIG. 1) in communication with the data center 600 of FIG. 6 to control the use of evaporative cooling.

The process 800 begins when outside air is drawn (810) at ambient conditions into an entry zone of a data center (e.g., the entry zone 608). For example, the ambient conditions may be the naturally occurring temperature and humidity of the outdoor air that surrounds the data center. Atomized water is sprayed (820) into the outside air at a location, an evaporation zone, downstream of the entry zone (e.g., the evaporation zone 612). The atomized water is allowed (830) to evaporate and cool the outside air in the evaporation zone.

The cool air is directed (840) to one side of a heat exchanger positioned between the evaporation zone and a rack zone. For example, the heat exchangers 620 and 750 are positioned at the boundary between the outside air supply and the indoor air that is supplied to the work space 630 and a rack zone occupied by the racks 632a-632d. The cool air is directed (840) through one side of the heat exchangers 620 by the outside air plenum 616.

Hot air from the rack zone is directed (850) into an opposite side of the heat exchanger to cool the air. For example, the indoor air plenum 618 directs air heated by the computers over the other side of the heat exchangers 620.

Optionally, a supplemental cooling system may be activated (855) as needed. For example, some outdoor environmental conditions (e.g., outdoor air with very high relative humidity) may limit how effectively the evaporative cooling system 602 may be able to cool the data center 600. To supplement the cooling effect provided by the evaporative cooling system 602, a supplemental cooling system including the components 118-134 of FIG. 1C (e.g., chillers, cooling towers, heat exchangers, pumps) may be optionally engaged to further cool the air in the data center 600.

The cooled air from the heat exchangers is then recirculated (860) back into the rack zone. For example, the cool air plenum 650 carries air cooled by the heat exchangers 620 back to the work space 630 where the air is dispersed by the diffusers 624.

In some implementations, the process 800 may be used in addition to, or in conjunction with, processes for controlling data center temperatures using a supplemental cooling system. For example, cooling towers, water-to-water and air-to-water heat exchangers, chillers, or other equipment may be used to supplement the cooling provided by an evaporative cooling system controlled by the process 800. In some implementations, a controller executing the steps of the process 800 may selectively activate the supplemental cooling system based on the measurements and on the temperature and relative humidity set points for the rack zone.

Figure 9:
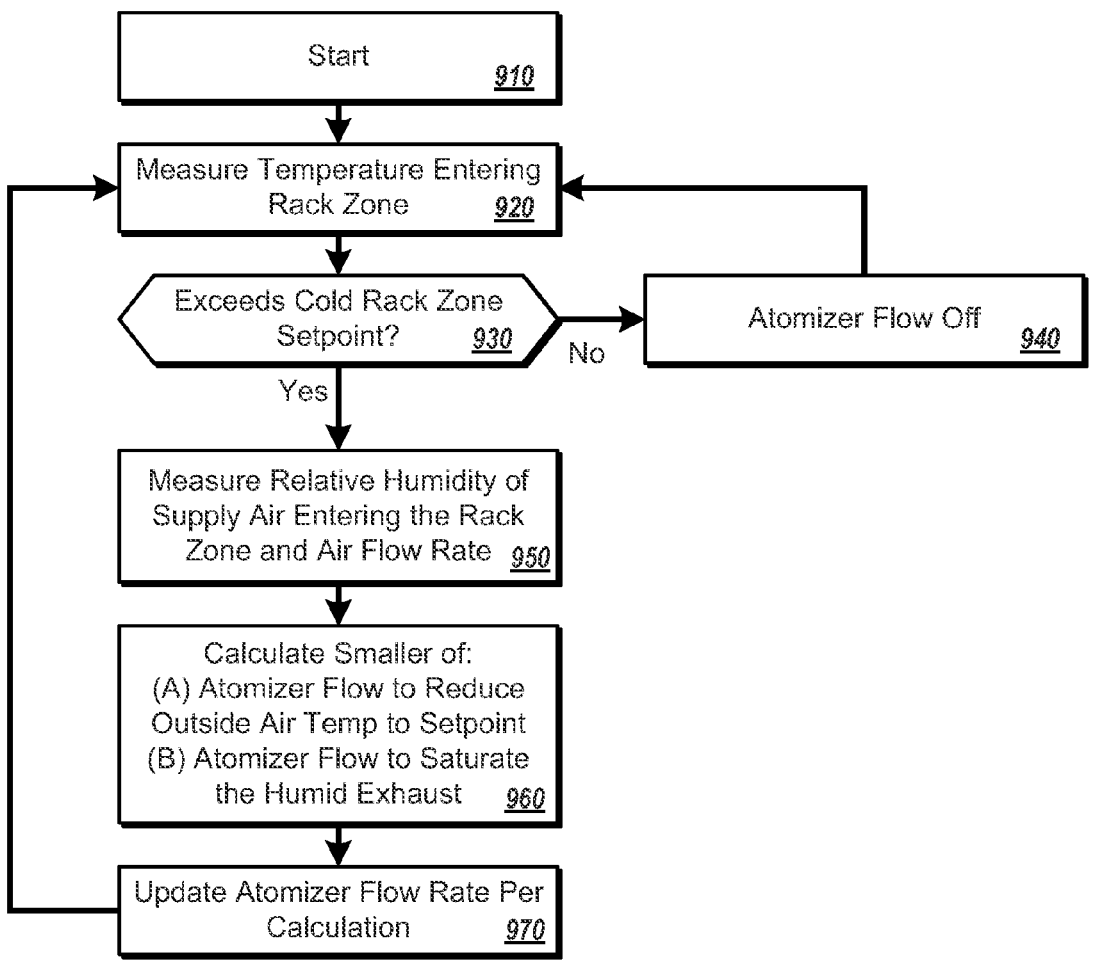
FIG. 9 is a flow diagram of an example metered process for controlling indirect evaporative cooling in a data center.

FIG. 9 is a flow diagram of an example process 900. In general, the process 900 describes the control of a metered water flow in an evaporative cooling system in which cooled outdoor air indirectly cools the air inside a data center (e.g., through heat exchangers), such as in the data center 600 of FIG. 6. In some implementations, the process 900 may be used in the step 820 of the process 800. In some implementations, the process 900 may be performed by a controller in communication with the various cooling systems of the data center, such as the controller 170 of FIG. 1.

The process 900 starts (910) and the temperature of the air entering a rack zone is measured (920). The temperature measurement is used to determine (930) if the temperature exceeds the cold rack zone setpoint. If the temperature does not exceed the cold rack setpoint, then the atomizer flow is maintained off (940) and the temperature is measured (920) again.

Figure 10:
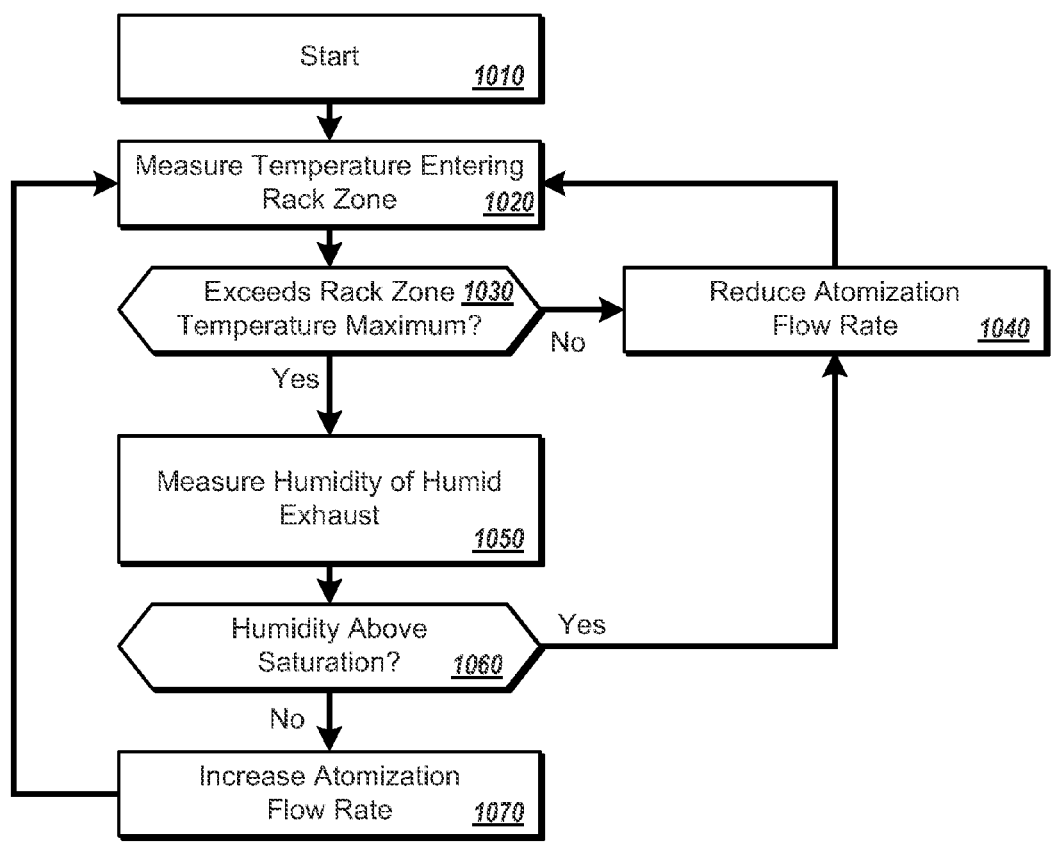
FIG. 10 is a flow diagram of an example feedback-based process for controlling indirect evaporative cooling in a data center.

Otherwise, the relative humidity and air flow rate of the supply air entering the rack zone is measured (950). The smaller of (A) the atomizer flow needed to reduce the outside air temperature to the setpoint, or (B) the atomizer flow needed to saturate the humid exhaust, is calculated (960). For example, the flow rate (A) may be implemented when the outdoor air is sufficiently dry to allow evaporative cooling to reduce the air temperature to the cool rack zone setpoint. In another example, the flow rate (B) may be implemented to cool the outside air as much as possible while still substantially evaporating the atomized water, thereby possibly preventing liquid water from precipitating out of the outside air or condensing within the plenum or heat exchangers. The calculated (960) flow rate is then used to update (970) the atomizer flow rate (e.g., to turn on the atomizer flow if off, or adjust the atomizer flow if already on). Once the flow rate has been updated (970) the air temperature is measured (920)

once again. As such, the flow rate is varied based on the previous atomizer flow rate, the measured air temperature, the measured relative humidity, and the rack zone temperature and humidity set points. Under some conditions, such as very high outside temperatures and/or relative humidities, the evaporative cooling system may not provide sufficient cooling even when the atomizer flow rate is at its substantially maximum flow rate. In some implementations, additional cooling beyond the capacity of the evaporative cooling system may be provided by activating a supplemental cooling system. FIG. 10 is a flow diagram of an example process 1000. In general, the process 1000 describes a feedback-fed control of water flow in an evaporative cooling system in which the cooled air is used to indirectly cool (e.g., using heat exchangers or heat wheels) a data center, such as the data center 600, and the computers inside it. In some implementations, the process 1000 may be used in the step 820 of the process 800. In some implementations, the process 1000 may be performed by a controller in communication with the various cooling systems of the data center, such as the controller 170 of FIG. 1.

The process 1000 starts (1010) and the temperature of the air entering a rack zone is then measured (1020) to determine (1030) if the air temperature exceeds a rack zone maximum temperature. If the temperature is determined (1030) to not exceed the rack zone maximum temperature, then the atomization flow rate is reduced (1040) and the air temperature is measured (1020) again. Otherwise, the humidity of the humid exhaust is measured (1050). For example, if the temperature does not exceed the rack zone's upper operating temperature, then no additional cooling of the outside air may be needed thereby conserving water.

If the humidity of the humid exhaust is determined (1060) to be above saturation, then the atomization flow rate remains off or is reduced (1040). For example, the flow rate may be reduced (1040) since saturated air cannot evaporate additional liquid water. As such, the atomized mist may pool as liquid water within the evaporation zone 612, condense within the plenum 616 or the heat exchangers 620, or be vented outside without substantially cooling the air. Otherwise, the atomization flow rate is increased (1070) and the air temperature is measured (1020) again. As such, the flow rate is varied based on the previous atomizer flow rate, the measured air temperature, the measured relative humidity, and the rack zone temperature and humidity set points. Under some conditions, such as very high outside temperatures and/or relative humidities, the evaporative cooling system may not provide sufficient cooling even when the atomizer flow rate is at its substantially maximum flow rate. In some implementations, additional cooling beyond the capacity of the evaporative cooling system may be provided by activating a supplemental cooling system.

A number of embodiments have been described. Nevertheless, it will be understood that various modifications can be made without departing from the spirit and scope of the invention.

In addition, the logic flows depicted in the figures do not require the particular order shown, or sequential order, to achieve desirable results. In addition, other steps can be provided, or steps can be eliminated, from the described flows, and other components can be added to, or removed from, the described systems. Accordingly, other embodiments are within the scope of the following claims.

What is claimed is:

1. A data center cooling system comprising:
    a plurality of fans arranged in a plurality of rows and a plurality of columns in a bank of fans, the plurality of fans configured to circulate outside air at ambient conditions through a human-occupiable workspace that includes an entry zone comprising an opening in an exterior wall of a data center;
    a plurality of atomizers positioned downstream of the entry zone and across an area substantially the same as the opening in the exterior of the wall of the data center, the plurality of atomizers configured to spray atomized water into the circulating outside air;
    an evaporation zone where the atomized water evaporates and cools the outside air to produce cooled air;
    a rack zone positioned downstream of the evaporation zone that comprises a plurality of computer racks arranged in a plurality of substantially parallel rows;
    wherein the plurality of fans are further configured to circulate the cooled air from the evaporation zone into the rack zone.

2. The system of claim 1, further comprising:
    a cool air plenum in fluid communication with the evaporation zone and configured to capture the cooled air and then to direct the cooled air into the rack zone at predetermined discrete locations.

3. The system of claim 2, wherein the cool air plenum comprises one or more conduits positioned above and substantially sealed from the rack zone and is in fluid communication with one or more diffusers configured to direct the cooled air downwardly into the rack zone.

4. The system of claim 2, wherein the cool air plenum comprises one or more conduits positioned below and substantially sealed from the rack zone and is in fluid communication with one or more diffusers configured to direct the cool air upwardly into the rack zone.

5. The system of claim 1, further comprising:
    a hot air plenum in fluid communication with the rack zone and configured to capture heated air that has been circulated past electronic equipment in the rack zone.

6. The system of claim 5, wherein the hot air plenum comprises one or more conduits positioned above a top level of the rack zone such that hot air vents upwardly into the hot air plenum.

7. The system of claim 5, wherein the hot air plenum comprises one or more conduits positioned beneath a bottom level of the rack zone, the system further comprising one or more fans configured to draw hot air from the rack zone downwardly into the hot air plenum.

8. The system of claim 1, wherein the entry zone comprises a plurality of louvers extending across the opening.

9. The system of claim 8, further comprising:
    a filter system positioned inside the entry zone upstream of the plurality of fans to filter outside air entering the entry zone.

10. The system of claim 1, further comprising:
    a cool air plenum configured to capture the cooled air and to direct the cooled air into the rack zone, the cool air plenum comprising:
        a supply conduit in fluid communication with the evaporation zone that extends substantially the width of the rack zone and is configured to capture the cooled air from the evaporation zone;
        a plurality of delivery conduits connected to the supply conduit, each projecting in a substantially perpendicular direction from the supply conduit and extending substantially the length of the rack zone.

11. The system of claim 10, wherein the cool air plenum is positioned above the rack zone and the plurality of delivery conduits are in sealed fluid communication with a plurality of diffusers configured to direct the cool air downwardly into the rack zone.

12. The system of claim 10, wherein the cool air plenum is positioned below a floor that supports equipment in the rack zone, and the plurality of delivery conduits are in sealed fluid communication with a plurality of diffusers configured to direct the cool air upwardly through perforations in the floor into the rack zone.

13. The system of claim 10, further comprising:
one or more exhaust fans configured to draw, into a hot air plenum, heated air that has been circulated past electronic equipment in the rack zone; and
the hot air plenum configured to capture the heated air, comprising:
an exhaust conduit that extends substantially the width of the rack zone and is configured to receive the hot air from a plurality of return conduits and to vent the hot air outside the data center; and
the plurality of return conduits connected to the exhaust conduit, each projecting in a substantially perpendicular direction from the exhaust conduit and extending substantially the length of the rack zone, wherein the return conduits include one or more apertures such that the hot air is drawn from the rack zone into the return conduit through the apertures and directed to the exhaust conduit;
wherein the plurality of delivery conduits of the cool air plenum are arranged in parallel to the plurality of return conduits of the hot air plenum and alternate with each other across the width of the rack zone.

14. The system of claim 1, wherein:
the entry zone comprises a plurality of louvers extending across the opening; and
the plurality of atomizers comprises atomizers spaced at intervals in rows extending across the bank of fans.

15. The system of claim 1, wherein:
the entry zone comprises a plurality of louvers extending across the opening; and
the plurality of atomizers comprises atomizers spaced at intervals in a row positioned above and downstream of the plurality of fans.

16. The system of claim 1, further comprising:
a control system comprising:
a thermometer configured to measure a wet or dry bulb temperature, or both, of the outside air;
a flow meter configured to measure a rate of flow of cooled air into the rack zone;
a humidistat configured to measure a humidity level of the cooled air; and
a controller configured to receive the measurements from the thermometer, flow meter, and humidistat, and to control the flow rate of water to the plurality of atomizers based on the measurements and a temperature and humidity set point for the rack zone.

17. The system of claim 16, further comprising:
a supplemental cooling system for the data center that comprises:
a cooling tower;
a water-to-water heat exchanger in fluid communication with the cooling tower;
an air-to-water heat exchanger in fluid communication with the water-to-water heat exchanger and positioned to receive hot air from the rack zone
wherein:
the supplemental cooling system is arranged to be activated to cool the hot air from the rack zone and to recirculate the cooled air back into the rack zone;
the controller is further configured to selectively activate the supplemental cooling system to cool the rack zone based on the measurements and on the temperature and relative humidity set point for the rack zone.

18. The system of claim 17, wherein:
the supplemental cooling system further comprises a chiller in fluid communication with the air-to-water heat exchanger; and
the controller is further configured to selectively activate the chiller based on the measurements and on the temperature and relative humidity set point for the rack zone.

19. The system of claim 1, further comprising:
a control system comprising:
a thermometer configured to measure the temperature of the cool air;
a humidistat configured to measure the relative humidity of the cool air;
a controller configured to receive the measurements from the thermometer and humidistat and to control the flow rate of water to the plurality of atomizers based on the measurements and a maximum allowable temperature and relative humidity for the rack zone.

20. The system of claim 19, further comprising:
a supplemental cooling system for the data center that comprises:
a cooling tower;
a water-to-water heat exchanger in fluid communication with the cooling tower;
an air-to-water heat exchanger in fluid communication with the water-to-water heat exchanger and positioned to receive hot air from the rack zone
wherein:
the supplemental cooling system is arranged to be activated to cool the hot air from the rack zone and to recirculate the cooled air back into the rack zone;
the controller is further configured to selectively activate the supplemental cooling system to cool the rack zone based on the measurements and on the maximum allowable temperature and relative humidity for the rack zone.

21. The system of claim 20, wherein:
the supplemental cooling system further comprises a chiller in fluid communication with the air-to-water heat exchanger; and
the controller is further configured to selectively activate the chiller based on the measurements and on the maximum allowable temperature and relative humidity for the rack zone.

22. The system of claim 1, wherein the rack zone is directly downstream of the evaporation zone, such that the outside air is passed directly from the evaporation zone to the rack zone.

23. The system of claim 22, wherein the evaporation zone comprises a volume of space that is sufficient to allow atomized water sprayed by the plurality of atomizers to evaporate substantially completely, such that liquid water is inhibited from entering the rack zone.

24. The system of claim 1, wherein the opening in the wall of the data center is configured to receive outside air carried by naturally prevailing winds.

25. The system of claim 16, wherein the controller is configured to control the flow rate of the water to the plurality of atomizers by determining the lower of:

an atomizer flow rate that is sufficient to reduce the outside air temperature to the temperature set point of the rack zone; and an atomizer flow rate that is sufficient to raise the relative humidity of the outside air to the relative humidity set point of the rack zone.

26. The system of claim 16, wherein the controller is configured to control the flow rate of the water to the plurality of atomizers by:

reducing a current atomizer flow rate based on the temperature of the outside air being lower than the temperature set point of the rack zone;

reducing the current atomizer flow rate based on the temperature of the outside air being greater than the temperature set point of the rack zone and the relative humidity of the outside air is greater than the relative humidity set point of the rack zone; or increasing the current atomizer flow rate based on the temperature of the outside air being greater than the temperature set point of the rack zone and the relative humidity of the outside air being lower than the relative humidity set point of the rack zone.

27. The system of claim 1, further comprising one or more exhaust fans configured to circulate heated air into a hot air plenum that has been circulated past the plurality of computer racks in the rack zone, the one or more exhaust fans configured to maintain a predetermined temperature rise across the plurality of computer racks.

28. The system of claim 1, wherein the bank of fans is oriented perpendicular to a direction of airflow entering the entry zone.

29. The system of claim 1, wherein the bank of fans has substantially the same area as the opening in the exterior wall of the data center.

* * * * *